United States Patent
Sato et al.

(10) Patent No.: US 9,234,297 B2
(45) Date of Patent: Jan. 12, 2016

(54) SILICON CARBIDE SINGLE CRYSTAL WAFER AND MANUFACTURING METHOD FOR SAME

(75) Inventors: Shinya Sato, Tokyo (JP); Tatsuo Fujimoto, Tokyo (JP); Hiroshi Tsuge, Tokyo (JP); Masakazu Katsuno, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 14/241,623

(22) PCT Filed: Aug. 29, 2012

(86) PCT No.: PCT/JP2012/071885
§ 371 (c)(1),
(2), (4) Date: Feb. 27, 2014

(87) PCT Pub. No.: WO2013/031856
PCT Pub. Date: Mar. 7, 2013

(65) Prior Publication Data
US 2014/0363607 A1 Dec. 11, 2014

(30) Foreign Application Priority Data

Aug. 29, 2011 (JP) .................. 2011-186362
Apr. 9, 2012 (JP) .................. 2012-088413
Jul. 6, 2012 (JP) .................. 2012-152039

(51) Int. Cl.
*B32B 3/02* (2006.01)
*C30B 23/02* (2006.01)
(Continued)

(52) U.S. Cl.
CPC ................ *C30B 23/02* (2013.01); *C30B 23/00* (2013.01); *C30B 29/36* (2013.01); *H01L 29/1608* (2013.01); *Y10T 428/21* (2015.01)

(58) Field of Classification Search
CPC ........ C03B 23/00; C03B 23/02; C03B 29/36; H01L 29/1608; Y10T 428/21; Y10T 117/1016; Y10T 117/1032
See application file for complete search history.

(56) References Cited

U.S. PATENT DOCUMENTS

| 7,135,074 B2 | 11/2006 | Gunjishima et al. |
| 2005/0211156 A1 | 9/2005 | Gunjishima et al. |

(Continued)

FOREIGN PATENT DOCUMENTS

| JP | 5-262599 A | 10/1993 |
| JP | 11-278985 A | 10/1999 |

(Continued)

OTHER PUBLICATIONS

International Search Report for PCT/JP2012/071885 mailed on Sep. 25, 2012.

(Continued)

*Primary Examiner* — Elizabeth Mulvaney
(74) *Attorney, Agent, or Firm* — Birch, Stewart, Kolasch & Birch, LLP

(57) ABSTRACT

Provided are a method for manufacturing a SiC single crystal having high crystal quality and, in particular, extremely low screw dislocation density and a SiC single crystal ingot obtained by the method. In particular, provided is a silicon carbide single crystal substrate that is a substrate cut from a bulk silicon carbide single crystal grown by the Physical Vapor Transport (PVT) method, in which the screw dislocation density is smaller in the peripheral region than in the center region, so that screw dislocations are partially reduced. The method is a method for manufacturing a SiC single crystal by the PVT method using a seed crystal and the ingot is a SiC single crystal ingot obtained by the method. Particularly, the silicon carbide single crystal substrate is a silicon carbide single crystal substrate in which when, by representing the diameter of the substrate as R, a center circle region having a diameter of 0.5×R centered around a center point O of the substrate and a doughnut-shaped peripheral region remaining by excluding the center circle region are defined, the average value of screw dislocation densities observed in the doughnut-shaped peripheral region is 80% or less of the average value of screw dislocation densities observed in the center circle region.

20 Claims, 3 Drawing Sheets

(51) Int. Cl.
*C30B 29/36* (2006.01)
*C30B 23/00* (2006.01)
*H01L 29/16* (2006.01)

(56) References Cited

U.S. PATENT DOCUMENTS

2006/0073707 A1 4/2006 Powell et al.
2010/0180814 A1* 7/2010 Wu et al. ............................ 117/3

FOREIGN PATENT DOCUMENTS

| JP | 2002-284599 A | 10/2002 |
| JP | 2002-308698 A | 10/2002 |
| JP | 2003-523918 A | 8/2003 |
| JP | 2007-119273 A | 5/2007 |
| JP | 2007-230823 A | 9/2007 |
| JP | 2010-64920 A | 3/2010 |
| JP | 5506954 B2 | 5/2014 |
| WO | WO 01/63020 A1 | 8/2001 |

OTHER PUBLICATIONS

Extended European Search Report, issued Jan. 26, 2015, for European Application No. 12828338.9.

* cited by examiner

SILICON CARBIDE SINGLE CRYSTAL WAFER AND MANUFACTURING METHOD FOR SAME

TECHNICAL FIELD

The present invention relates to a method for manufacturing a silicon carbide single crystal having less screw dislocations and high crystal quality, and to a silicon carbide single crystal substrate obtained by the same. Silicon carbide single crystal substrates manufactured from a silicon carbide single crystal obtained by the manufacturing method of the present invention through processing and polishing steps are mainly used for various semiconductor electronic devices or as substrates therefor. In particular, the present invention relates to a silicon carbide single crystal substrate cut from a bulk silicon carbide single crystal grown by the Physical Vapor Transport (PVT) method, and, specifically, to a silicon carbide single crystal substrate having less screw dislocations in the peripheral region of the substrate than the center region thereof.

BACKGROUND ART

Silicon carbide (SiC) is a wide band gap semiconductor having a wide band gap of 2.2 to 3.3 eV. Due to excellent physical and chemical characteristics thereof, SiC as a semiconductor material having environmental resistance is under research and development. In recent years, SiC has been used as a material for optical devices using the short wavelength range of from blue light to ultraviolet light, high frequency electronic devices, high voltage and high power electronic devices, and the like, and research and development for manufacturing SiC devices (semiconductor elements) have been vigorous.

In the advancement of practical applications of SiC devices, it is essential to manufacture SiC single crystals having a large diameter. In many cases, growing a bulk SiC single crystal by the PVT method has been employed (Lely Method or modified Lely Method). Specifically, a SiC sublimation raw material is contained in a crucible, then, a seed crystal composed of a SiC single crystal is attached to the lid of the crucible, and the raw material is sublimated, whereby recrystallization causes the SiC single crystal to grow on the seed crystal. Then, a SiC bulk single crystal (a SiC single crystal ingot) having a substantially cylindrical shape is obtained and then cut to a thickness of, in general, approximately 300 to 600 μm to manufacture a SiC single crystal substrate, which is used to form SiC devices in electric and electronic fields and the like.

A SiC single crystal contains hollow-core defects passing through in a growing direction, which are called micropipes, as well as crystal defects such as dislocation defects and stacking faults. These crystal defects deteriorate device performance. Therefore, the reduction of such defects is an important issue in applications for SiC devices.

Among them, dislocation defects include threading edge dislocations, basal plane dislocations, and screw dislocations. For example, it has been reported that commercially available SiC single crystal substrates have approximately $8 \times 10^2$ to $3 \times 10^3$ ($/cm^2$) of screw dislocations, $5 \times 10^3$ to $2 \times 10^4$ ($/cm^2$) of threading edge dislocations, and $2 \times 10^3$ to $2 \times 10^4$ ($/cm^2$) of basal plane dislocations (see Non-Patent Literature 1).

In recent years, research and investigation relating to crystal defects of SiC and device performance has advanced and influences of the various defects are becoming clear. Among them, there are reports including leakage current in devices and decreased life of gate oxide film due to screw dislocations (see Non-Patent Literature 2 and 3). In order to form a high performance SiC device, at least, a SiC single crystal substrate having less screw dislocations is needed.

In addition, regarding the reduction of screw dislocations in a SiC single crystal, for example, there is a case reported in which the number of screw dislocations has been reduced to 67 ($/cm^2$) by metastable solvent epitaxy (MSE method) (Non-Patent Literature 4). Additionally, another report describes that screw dislocations are dissociated into Frank-type stacking faults during epitaxial growth by chemical vapor deposition method (CVD method) (see Non-Patent Literature 5). However, in both of these methods, the growth rate of the SiC single crystal is several micrometers per hour, which is 1/10 or less of the growth rate of an ordinary SiC single crystal in the PVT method. Thus, it is difficult to employ the methods as industrial production methods.

On the other hand, regarding the PVT method, there has been reported a method of obtaining a SiC single crystal having less micropipes and screw dislocations by growing a SiC single crystal as an initially grown layer at a predetermined growth pressure and a predetermined substrate temperature and then performing crystal growth while gradually decreasing the substrate temperature and the pressure (see Patent Literature 1). However, the screw dislocation density of the SiC single crystal obtained by this method is $10^3$ to cm$^2$ $10^4$ ($/cm^2$) (see the section of "Advantageous Effects" in the specification of Patent Literature 1). Considering applications to high performance SiC devices, further reduction of screw dislocations is necessary.

In addition, there has been reported a method for suppressing the occurrence of micropipes and reducing dislocation density of screw dislocations and the like by growing a SiC single crystal as an initially grown layer at a predetermined growth pressure and a predetermined substrate temperature and then growing the crystal by reducing the pressure to increase growth rate while maintaining the substrate temperature as it is (see Patent Literature 2). However, even with this method, the effect of reducing screw dislocations is insufficient.

Additionally, in the PVT method, besides a screw dislocation having a Burgers vector of <0001>, a threading mixed dislocation is reported to have been generated from a threading edge dislocation with a Burgers vector of 1/3<11-20> (0001) propagating in the basal plane (see Non-Patent Literature 6). However, the phenomenon accidentally occurs during crystal growth, and there is no reported case in which it was controlled, as far as the present inventors know.

CITATION LIST

Patent Literature

[Patent Literature 1] Japanese Laid-open Patent Publication No. 2002-284599
[Patent Literature 2] Japanese Laid-open Patent Publication No. 2007-119273

Non-Patent Literature

[Non-Patent Literature 1] Noboru Ohtani, Proceedings of the 17th SiC and Related Wide Bandgap Semiconductors, 2008, P 8.
[Non-Patent Literature 2] Bando et al., Proceedings of the 19th SiC and Related Wide Bandgap Semiconductors, 2010, p 140-141.

[Non-Patent Literature 3] Yamamoto et al., Proceedings of the 19th SiC and Related Wide Bandgap Semiconductors, 2010, p 11-12.

[Non-Patent Literature 4] Nagata et al., Proceedings of the 18th SiC and Related Wide Bandgap Semiconductors, 2009, p 68-69.

[Non-Patent Literature 5] H. Tsuchida et al., Journal of Crystal Growth, 310, (2008), 757-765.

[Non-Patent Literature 6] D. Nakamura et al., Journal of Crystal Growth, 304, (2007) 57-63.

SUMMARY OF INVENTION

Therefore, it is an object of the present invention to provide a method for manufacturing a SiC single crystal having high crystal quality, and particularly, extremely low screw dislocation density. In addition, it is another object of the present invention to provide a silicon carbide single crystal ingot and a silicon carbide single crystal substrate obtained by the method and having extremely low screw dislocation density. In particular, it is an object of the present invention to provide a silicon carbide single crystal substrate that is a substrate cut from a bulk silicon carbide single crystal grown by the PVT method and in which screw dislocation density is smaller in the peripheral region than in the center region, so that the screw dislocation density is partially reduced.

The present inventors conducted intensive and extensive studies in view of the above circumstances and, as a result, obtained a new finding that, in the growth of a silicon carbide (SiC) single crystal by the PVT method, screw dislocations included in a silicon carbide single crystal can be structurally converted to stacking faults by growing the silicon carbide single crystal to a predetermined thickness in a specific growth atmosphere at a specific seed crystal temperature. In addition, the present inventors newly found that, surprisingly, when growing a bulk SiC single crystal, by employing predetermined growth conditions in a part of the growing process, a SiC single crystal substrate cut from the subsequently grown SiC single crystal has a lower screw dislocation density in the peripheral region of the substrate than in the center region thereof.

Then, with the use of a SiC single crystal substrate in which screw dislocations are reduced even partially, a high performance SiC device can be manufactured by selectively form a device in the substrate, and yield in the formation of a device is improved. These findings led the inventors to the completion of the present invention.

Specifically, the gist of the present invention is as follows:

(1) A silicon carbide single crystal substrate that is a disk-shaped silicon carbide single crystal substrate cut from a bulk SiC single crystal grown by the PVT method, the silicon carbide single crystal substrate being characterized in that when, by representing the diameter of the substrate as R, a center circle region having a diameter of 0.5×R centered around a center point O of the substrate and a doughnut-shaped peripheral region remaining by excluding the center circle region of the substrate are defined, the average value of screw dislocation densities observed in the doughnut-shaped peripheral region is 80% or less of the average value of screw dislocation densities observed in the center circle region.

(2) The silicon carbide single crystal substrate according to the (1), wherein the average value of the screw dislocation densities observed in the doughnut-shaped peripheral region is 60% or less of the average value of the screw dislocation densities observed in the center circle region.

(3) The silicon carbide single crystal substrate according to the (1), wherein the average value of the screw dislocation densities observed in the doughnut-shaped peripheral region is 50% or less of the average value of the screw dislocation densities observed in the center circle region.

(4) The silicon carbide single crystal substrate according to any of the (1) to the (3), wherein when four diameters dividing the circumference of the substrate into eight equal parts are arbitrarily selected on the substrate and eight radii $r_1$ to $r_8$ extending radially from the center point O of the substrate set to 0 are regarded as axes, each scaled from 0 to 1, the average value of the screw dislocation densities observed in the center circle region is an average of values measured at total 17 measurement points of i) to iii) below and the average value of the screw dislocation densities observed in the doughnut-shaped peripheral region is an average of values measured at total 16 measurement points of iv) to v) below:

i) center point O
ii) $a_1$ to $a_8$
iii) $b_1$ to $b_8$
iv) $c_1$ to $c_8$
v) $d_1$ to $d_8$ wherein numerals appended to symbols a to d correspond to numerals of the radii $r_1$ to $r_8$ and, for example, $a_1$, $b_1$, $c_1$, and $d_1$ represent measurement points present on the radius $r_1$; among the measurement points, a and b represent measurement points present within a range of from more than 0 and not more than 0.5 in each radius, and c and d represent measurement points present within a range of from more than 0.5 and not more than 1; and eight measurement points having the same symbol are present on the same circle of each of the symbols a to d.

(5) The silicon carbide single crystal substrate according to the (4), wherein the average value of the screw dislocation densities observed in the doughnut-shaped peripheral region is 500/cm² or less.

(6) The silicon carbide single crystal substrate according to the (4), wherein the average value of the screw dislocation densities observed in the doughnut-shaped peripheral region is 300/cm² or less.

(7) The silicon carbide single crystal substrate according to the (4), wherein the average value of the screw dislocation densities observed in the doughnut-shaped peripheral region is 100/cm² or less.

(8) A method for manufacturing a silicon carbide single crystal by the PVT method using a seed crystal, the method being characterized by including:

a first growth step of growing a silicon carbide single crystal having a thickness of at least 0.5 mm at a first growth atmosphere pressure of from 3.9 to 39.9 kPa and a first growth temperature in which the temperature of the seed crystal is not less than 2100° C. and below 2300° C., and a second growth step of growing the silicon carbide single crystal to a larger thickness than in the first growth step at a second growth atmosphere pressure of from 0.13 to 2.6 kPa and a second growth temperature in which the temperature of the seed crystal is higher than the first growth temperature and below 2400° C.

(9) The method for manufacturing a silicon carbide single crystal according to the (8), wherein the first growth atmosphere pressure is reduced to the second growth atmosphere pressure at a pressure changing rate of 12 kPa or less per hour.

(10) The method for manufacturing a silicon carbide single crystal according to the (8) or (9), wherein the first growth temperature is increased to the second growth temperature at a temperature changing rate of 40° C. or less per hour.

(11) The method for manufacturing a silicon carbide single crystal according to any of the (8) to (10), wherein the first growth step is performed at a crystal growth rate of 100 µm/hr or less.

(12) The method for manufacturing a silicon carbide single crystal according to any of the (8) to (11), wherein, in the entire growth process including the first and the second growth steps, the first growth step is performed within a time of ½ or less of the entire growth process after starting the crystal growth.

ADVANTAGEOUS EFFECTS OF INVENTION

The present invention can manufacture a high quality SiC single crystal in which screw dislocations are significantly reduced. Accordingly, a SiC single crystal substrate (wafer) cut from a SiC single crystal ingot obtained thereby can be applied to various electronic devices, as well as device characteristics, yield, and the like can be improved. In particular, since the SiC single crystal substrate of the present invention has a smaller screw dislocation density in the peripheral region of the substrate than in the center region thereof, for example, a high performance SiC device can be obtained by selectively forming a device in the substrate. In addition, since such a device formation corresponding to the distribution of screw dislocations can be made, improvement in yield and the like can be expected. Therefore, the present invention is industrially very useful.

DESCRIPTION OF EMBODIMENTS

Hereinafter, the present invention will be described in more detail.

A disk-shaped SiC single crystal substrate according to the present invention is cut from a bulk SiC single crystal grown by the PVT method. As described above, there are reported cases in which screw dislocations were successfully reduced in crystal growth in the MSE method and epitaxial growth of SiC in the CVD method.

However, the epitaxial growth of SiC by the MSE method or the CVD method is performed at a growth rate of 1/10 or less of the growth rate of an ordinary SiC single crystal grown by the PVT method and is completely different, in terms of the level of productivity, from a manner of manufacturing by cutting from a bulk SiC single crystal grown by the PVT method, as in the SiC single crystal substrate of the present invention. There has been so far no reported case on a method for reducing screw dislocations in the PVT method, particularly reducing screw dislocations in a doughnut-shaped peripheral region.

The present inventors conducted intensive and extensive studies on means for obtaining a SiC single crystal substrate having less screw dislocations by using the PVT method and, as a result, found that, when growing a bulk SiC single crystal, screw dislocation or the threading mixed dislocation (in the present specification, these are together referred to as screw dislocation" can be structurally converted to stacking faults by employing predetermined conditions in the initial period of the growth.

Figure 1:
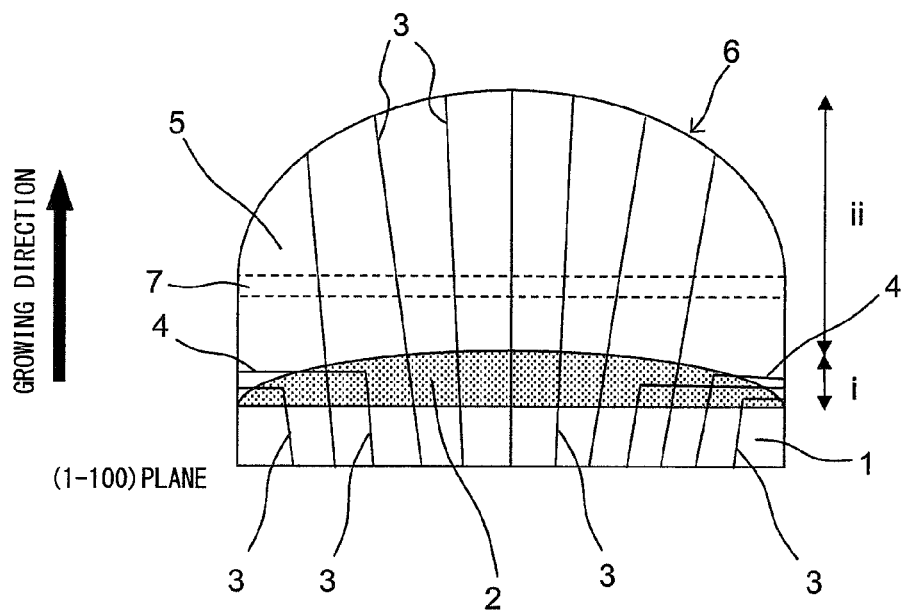
FIG. 1 is a cross-sectional schematic view illustrating a bulk SiC single crystal for obtaining a SiC single crystal substrate of the present invention.

Specifically, as indicated in FIG. 1, a part of a screw dislocation 3 generated by succession from a seed crystal 1 or the like stops extension in a growing direction and is converted to a stacking fault 4 by a structural conversion layer 2 formed by growth conditions relating to the structural conversion of an growth initial period (i). In that case, since the structural conversion is more likely to occur in the peripheral region of a crystal growth surface than in the center region thereof due to a mechanism as described below and the direction of extension of the stacking fault 4 is substantially perpendicular to the growing direction, the stacking fault 4 is expelled outside from the side surface of the crystal as the growth proceeds. Accordingly, by using such a structural conversion in the PVT method, the screw dislocation 3 is reduced in a crystal grown in the subsequent growth middle and late period (ii), with the result that a bulk SiC single crystal 6 can be obtained in which screw dislocation in the peripheral region has been reduced. The schematic cross-sectional view indicated in FIG. 1 depicts the crystallization growth of a SiC single crystal on a SiC seed crystal having a main surface of (000-1) plane and the cross-sectional view of FIG. 1 represents a (1-100) plane.

Such a structural conversion seems to occur, for example, in a case where when a SiC powder is used as raw material, there is a small difference between the amount of attached atoms from the SiC sublimation raw material and the amount of atoms leaving from the crystal surface in the sublimation, in other words, in a case where an equilibrium state or a quasi-equilibrium state is attained. Accordingly, although an ordinary SiC single crystal has a growth rate of 300 µm/h or more in the PVT method, the present invention makes growth conditions for performing a lower rate growth of 100 µm/h or less, preferably 50 µm/h or less, more preferably 30 µm/hr or less, and still more preferably 25 µm/h or less to form the structural conversion layer 2. In order to attain the equilibrium state as described above to structurally convert a screw dislocation to a stacking fault, the crystal growth rate is desirably set to those mentioned above and it is desirable that, as a length of time for a crystal growth step, 1 to 40 hours are taken to perform crystal growth.

Herein, in the PVT method, generally, in order to obtain a stable polytype SiC single crystal, there is provided a temperature gradient higher in the center region of the grown crystal than in the peripheral region thereof to form a bulk SiC single crystal while maintaining a protruded crystal growth surface. For this reason, the growth rate of the structural conversion layer 2 in the growth initial period is regarded as a rate in the center region where the crystal growth easily proceeds. In the results of various experiments conducted by the present inventors, when the growth rate in the center region of the grown crystal is 300 µm/h or less, the temperature of the grown crystal is higher in the peripheral region than in the center region. Thus, it seems that the amount of atoms leaving from the crystal surface in the peripheral region is larger, thus attaining the equilibrium state or the quasi-equilibrium state in the peripheral region. If the growth rate in the center region of the grown crystal is too slow, the time for forming the structural conversion layer 2 becomes too long, degrading productivity. Accordingly, the growth rate of the structural conversion layer 2 relating to the structural conversion is preferably 1 μm/h or more.

Specific growth conditions relating to the formation of the structural conversion layer 2 can be appropriately selected by using, as an indication, the growth rate in the center region of the grown crystal as described above. Usually, when growth atmosphere pressure is set high, the diffusion of raw material gas as the SiC sublimation raw material is delayed, which reduces the amount of atoms reaching a crystal growth surface. On the other hand, the amount of atoms leaving from the crystal surface is determined by a growth surface temperature. Accordingly, for example, in order to obtain a bulk SiC single crystal cut from a SiC single crystal substrate having a diameter of 100 mm, the temperature of the seed crystal is desirably from 2100 to 2400° C., and preferably from 2200 to 2300° C. In this case, it is preferable that the center region of the grown crystal has a temperature lower by approximately more than 0° C. and not more than 20° C. than the peripheral region thereof. In addition, the growth atmosphere pressure is from 2.6 to 65 kPa. The lower limit of the growth atmosphere pressure is preferably 3.9 kPa or more, more preferably 6.5 kPa or more, and still more preferably 13.3 kPa or more, and the upper limit thereof is preferably 39 kPa or less. Then, by a combination of these conditions, the equilibrium state or the quasi-equilibrium state can be attained at least in the peripheral region of the grown crystal. In addition, it is necessary to grow a silicon carbide crystal in this step also, and the growth rate becomes slower as the growth atmosphere pressure becomes higher, which is not suitable as an industrial manufacturing method. For these reasons and others, the growth atmosphere pressure is set to 39.9 kPa or less.

In addition, it is desirable to grow the crystal such that the thickness of the structural conversion layer 2 relating to structural conversion is favorably at least 0.5 mm and preferably 1 mm or more. When the thickness of the structural conversion layer 2 is below 0.5 mm, the structural conversion from screw dislocation to stacking fault may be insufficiently made. Additionally, the larger the thickness of the structural conversion layer 2, the more the structural conversion from screw dislocation to stacking fault is promoted. However, considering the degradation of productivity due to saturation of the effect and the like, the upper limit of the thickness can be 10 mm. The structural conversion layer 2 may be formed after growing a SiC single crystal to a certain degree of thickness at an ordinary growth rate in the PVT method. However, in order to ensure the achievement of a desired structural conversion, it is desirable to introduce the structural conversion layer 2 in the growth initial period. More specifically, the structural conversion layer 2 is, suitably, first formed on the seed crystal so as to be introduced at a time of starting the crystal growth.

After growing the structural conversion layer 2, the SiC single crystal may be grown by making the temperature of the seed crystal higher than the growth conditions relating to the structural conversion and making the growth atmosphere pressure lower than that. In other words, the growth conditions for a crystal grown portion (a main grown crystal) 5 grown after the structural conversion layer 2 are not particularly limited, and, as described above, a part of the screw dislocation 3 can be structurally converted to the stacking fault 4. Accordingly, in the main grown crystal 5 grown in the subsequent growth middle and late period (ii), the screw dislocation 3 is partially reduced. Thus, considering productivity and the like, the growth rate is desirably 100 μm/h or more and preferably 300 μm/h or more.

Specifically, similarly to the above, for example, in order to obtain a bulk SiC single crystal by cutting from a SiC single crystal substrate having a diameter of 100 mm, the temperature of the seed crystal is desirably increased to be higher than the growth conditions relating to the structural conversion within a range of from 2100 to 2400° C. and preferably is set within a range of from 2200 to 2300° C. In this case, similarly, the temperature of the center region of the grown crystal is desirably set lower by approximately more than 0° C. and not more than 20° C. In addition, the growth atmosphere pressure is desirably set lower than the growth conditions relating to the structural conversion within a range of from 0.13 to 2.6 kPa and preferably is set within a range of from 0.65 to 1.95 kPa.

Figure 2:
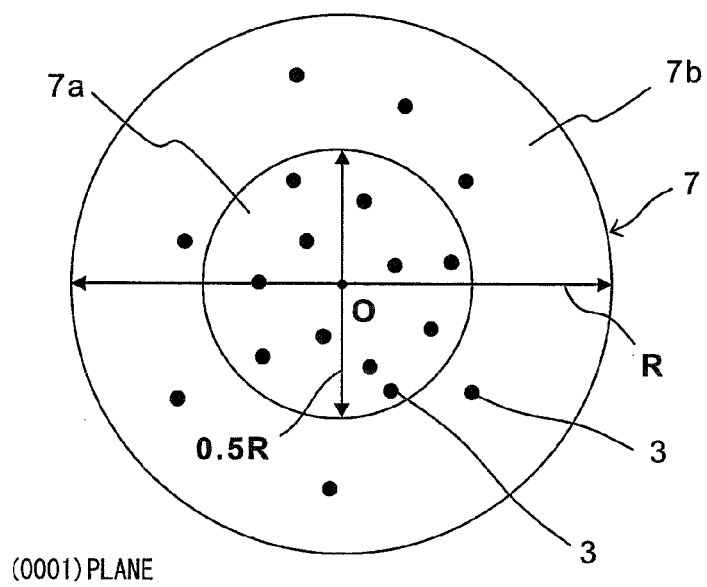
FIG. 2 is a plan schematic view illustrating a SiC single crystal substrate of the present invention.

The main grown crystal 5 is a portion to be mainly grown in the bulk SiC single crystal 6. When considering that the SiC single crystal substrate 7 is cut from the obtained SiC bulk single crystal 6, the thickness of the main grown crystal 5 grown after the structural conversion layer 2 is desirably 10 mm or more. Then, as indicated in FIG. 1, in the SiC single crystal substrate 7 cut from the main crystal grown portion 5 grown in the growth middle and late period (ii), the number of screw dislocations occurring on the surface thereof [(0001) plane] is less than in the peripheral region thereof than in the center region thereof, as indicated in FIG. 2. When considering the use of existing equipment or the like, the upper limit rate of the crystal growth is approximately 1000 μm/h. In addition, the upper limit of the thickness (length) thereof is not particularly limited, but considering performance of the present manufacturing apparatus and the like, the upper limit thickness is approximately 200 mm, and more realistically approximately 150 mm.

In addition, when switching to the growth conditions for the main grown crystal 5 after growing the structural conversion layer 2, pressure is reduced at a pressure changing rate of preferably 12 kPa or less per hour, more preferably 1 kPa or less per hour, and still more preferably 0.5 kPa or less per hour. As the changing range per a unit of time becomes larger, the temporal change amount in the growth rate increases. Accordingly, crystal growth during the time becomes unstable and crystal defects such as the coexistence of a different polytype can occur. In addition, by changing the pressure changing rate slowly (changing over time), the effect by the structural conversion step is further ensured. In other words, by expelling the stacking fault outside the crystal to prevent the reoccurrence of screw dislocation, a silicon carbide single crystal having less screw dislocations can be obtained, particularly less screw dislocations in the doughnut-shaped periphery. In view of these points, a slower pressure changing rate is more desirable. However, considering productivity, workability, and the like, the lower limit of the pressure changing rate is 0.1 kPa/hr. Due to the same reason, regarding switching of the growth temperature, the temperature is increased at a temperature changing rate of preferably 40° C. or less per hour, more preferably 10° C. or less per hour, and still more preferably 5° C. or less per hour. The same consideration as the pressure changing rate can also be applied to the temperature changing rate, and the lower limit thereof is 1° C./hr.

In the present invention, the structural conversion of screw dislocation to stacking fault is made by control of the growth atmosphere pressure and the growth temperature, so that the structural conversion does not depend on an off angle of the seed crystal used for crystal growth. The present inventors have confirmed that when the off angle is large, the possibility of occurrence of a different polytype can increase. Accordingly, it is suitable that the off angle of a substrate used for the seed crystal is preferably from 0 to 15° C., and more preferably from 0 to 8° C.

In addition, since the invention uses the structural conversion of screw dislocation as described above, there is no limitation by the polytype of a SiC single crystal obtained. For example, the structural conversion can also be applied to cases of obtaining bulk SiC single crystals, such as 4H-type as a typical polytype, 6H-type, and 3C-type. In particular, the structural conversion is advantageous in terms of obtaining a 4H-type SiC single crystal substrate expected as a more promising application for power devices. Furthermore, an apparatus for manufacturing a silicon carbide single crystal using a commonly used the PVT method can be used. Accordingly, for example, nitrogen doping or the like can be appropriately performed in crystal according to the purpose of use while controlling the amount of nitrogen gas or the like supplied into a growth atmosphere through a high purity gas pipe or a mass flow controller. Still furthermore, there is no particular limitation to the crystal diameter of the obtained bulk SiC single crystal. Thus, the structural conversion can be applied to a process for growing a crystal having a diameter of from 50 to 300 mm expected to be most promising at present.

Then, in order to cut a substrate from the main crystal grown portion 5 grown through the structural conversion layer 2, a known method can be employed. The thickness of the substrate and the like are also not particularly limited and various polishing methods and the like can be performed according to needs, thereby obtaining the SiC single crystal substrate 7 according to the present invention. In the obtained SiC single crystal substrate 7, as indicated in FIG. 2, when, by representing the diameter of the substrate as R and the center portion of the substrate as O, a center circle region 7a having a diameter of 0.5×R centered around the center point O and a doughnut-shaped peripheral region 7b remaining by excluding the center circle region 7a are defined, the average value of screw dislocation densities observed in the doughnut-shaped peripheral region 7b is 80% or less, preferably 60% or less, and more preferably 50% or less, of the average value of screw dislocation densities observed in the center circle region 7a. In other words, the substrate is a SiC single crystal substrate in which the screw dislocation density is smaller in the peripheral region of the substrate than in the center region thereof, so that screw dislocations are partially reduced.

In calculation of the average values of the respective screw dislocation densities in the center circle region 7a and the doughnut-shaped peripheral region 7b, the method for density measurement is not particularly limited. However, the most common method employed can be etching the substrate surface by immersion in molten KOH at approximately 500° C. and then observing the shape of an etched pit through an optical microscope to measure a screw dislocation density. Then, through the optical microscope, screw dislocation density can be measured at plural measurement points in the respective regions to obtain respective average values.

In this case, in order to suitably determine whether the substrate has lower screw dislocation density in the peripheral region than the central region, for example, it is preferable to select measurement points in the respective regions in a manner as described below to measure screw dislocation densities so as to obtain the respective average values. However, the selection of the measurement points described below is merely one example and obviously, the present invention is not limited thereto.

Specifically, when four diameters dividing the circumference of the substrate into eight equal parts are arbitrarily selected on the substrate and eight radii $r_1$ to $r_8$ extending radially from the center point O of the substrate set to 0 are regarded as axes, each scaled from 0 to 1, the average value of the screw dislocation densities observed in the center circle region 7a is obtained as an average of values measured at total 17 measurement points of i) to iii) below. Similarly, the average value of the screw dislocation densities observed in the doughnut-shaped peripheral region 7b is obtained as an average of values measured at total 16 measurement points of iv) to v) below.

i) center point O
ii) $a_1$ to $a_8$
iii) $b_1$ to $b_8$
iv) $c_1$ to $c_8$
v) $d_1$ to $d_8$ Herein, numerals appended to symbols a to d correspond to numerals of the $r_1$ to $r_8$ and, for example, $a_1$, $b_1$, $c_1$, and $d_1$ represent measurement points present on the radius $r_1$; among the measurement points, a and b represent measurement points present within a range of from more than 0 and not more than 0.5 in each radius, and c and d represent measurement points present within a range of from more than 0.5 and not more than 1. Herein, scale mark 0 corresponds to the center point O of the substrate and scale mark 1 represents a position corresponding to a point on the circumference of the substrate. In addition, respective eight measurement points having the same symbol are present on the same circle of each of the symbols a to d.

In addition, in the SiC single crystal substrate of the present invention, for example, the average value of the screw dislocation densities observed in the center circle region 7a is approximately 1000/cm$^2$, whereas the average value of the screw dislocation densities observed in the doughnut-shaped peripheral region 7b is 500/cm$^2$ or less. Specifically, the average value of the screw dislocation densities observed in the center circle region 7a is mainly in a range of 800 to 1200/cm$^2$, whereas the average value of the screw dislocation densities observed in the doughnut-shaped peripheral region 7b is 500/cm$^2$ or less, preferably 300/cm$^2$ or less, and more preferably 100/cm$^2$ or less. The average value of the screw dislocation densities observed in the doughnut-shaped peripheral region 7b is 80% or less, preferably 60% or less, and more preferably 50% or less of the average value of the screw dislocation densities observed in the center circle region 7a. When considering the inevitable occurrence of screw dislocation and the like due to growth disturbance factors such as impurities included in the raw material and adhesion of graphite onto the growth surface from the side wall of a graphite crucible, the upper limit of the average value of the screw dislocation densities observed in the doughnut-shaped peripheral region is theoretically 0.1/cm$^2$ and substantially 1/cm$^2$.

In the SiC single crystal substrate obtained by the present invention, screw dislocation is partially reduced, and particularly screw dislocation is reduced in the doughnut-shaped peripheral region. Thus, for example, by selectively forming a device in the substrate, yield in the formation of devices can be improved. In addition, in the peripheral region of the substrate having less screw dislocations, it is possible to form a high performance device in which leakage current and decrease in the life of oxide film due to screw dislocations are reduced, and, for example, it is suitable to form a MOSFET, a JFET, or the like.

Hereinabove, the description has been given of the SiC single crystal substrate obtained by the present invention in which screw dislocation is partially reduced. Hereinafter, another embodiment of the present invention will be described in more detail. In this embodiment, a high quality SiC single crystal in which screw dislocation is significantly reduced can be manufactured. Accordingly, a SiC single crystal substrate (wafer) cut from a SiC single crystal ingot obtained thereby can be applied to various devices, as well as device characteristics, yield, and the like can be improved.

As described above, although it has been known that in crystal growth by MSE method and epitaxial growth by chemical vapor phase deposition (CVD method), a screw dislocation is dissociated into a stacking fault during the growth, there has been so far no reported case on the occurrence of the same phenomenon in the PVT method, as far as the inventors know.

The present inventors found that when growing a silicon carbide single crystal by the PVT method, a screw dislocation or the above threading mixed dislocation (hereinafter together referred to as screw dislocation) is structurally converted to a stacking fault by a first growth step of growing a silicon carbide single crystal having a thickness of at least 0.5 mm at a first growth atmosphere pressure of from 3.9 to 39.9 kPa and a first growth temperature in which the temperature of a seed crystal is not less than 2100° C. and below 2300° C. With the structural conversion, the extension of screw dislocation in a growing direction is stopped, and since the direction of extension of stacking fault is substantially perpendicular to the growing direction. Accordingly, as the growth proceeds, the stacking fault is expelled from a side surface of the crystal to the outside thereof. Therefore, the use of the structural conversion (structural conversion induced growth) allows for the formation of a silicon carbide single crystal ingot having less screw dislocations.

The mechanism of causing the conversion of screw dislocation to staking fault is inferred as follows.

The MSE method is a crystal growth method performed in equal temperature environment and said to be a crystal growth method for attaining a quasi-equilibrium state, which is closest to the equilibrium state among various SiC single crystal growth methods. The conversion of screw dislocation to stacking fault in the quasi-equilibrium state implies that stacking fault has more energetic stability than screw dislocation in SiC single crystal. However, the growth rate in the MSE method is 1/10 or less of that of the PVT method. Accordingly, even when these growth conditions including CVD method are applied as they are to the PVT method, the same equilibrium state cannot be immediately attained.

Thus, by growing a silicon carbide single crystal at the first growth atmosphere pressure and the first growth temperature, the quasi-equilibrium state is attainable in the PVT method. In other words, when the growth atmosphere pressure is set high, the diffusion of raw material gas is delayed, whereby the amount of the raw material gas reaching the crystal growth surface is reduced. On the other hand, the amount of atoms leaving from the crystal surface is determined depending on growth surface temperature. Accordingly, it seems that the difference between the amounts of attached atoms and leaving atoms can be made small and thus a near-equilibrium state can be obtained by maintaining the temperature of the seed crystal at a temperature of not less than 2100° C. and below 2300° C. suitable for crystal growth and setting the growth atmosphere pressure to a pressure of from 3.9 to 39.9 kPa and preferably from 13.3 to 39.9 kPa. In addition, in the first growth step also, it is necessary to grow the silicon carbide crystal, and as the growth atmosphere pressure increases, the growth rate becomes slower, which is not suitable as an industrial production method. For these reasons and others, the growth atmosphere pressure is set to 39.9 kPa or less.

In addition, the silicon carbide single crystal grown at the first growth atmosphere pressure and the first growth temperature is formed so as to have a thickness of at least 0.5 mm, and preferably 1 mm or more. When the thickness thereof is below 0.5 mm, the structural conversion from screw dislocation to stacking fault may not be sufficiently made. Additionally, the larger the thickness of the silicon carbide single crystal grown at the first growth step, the more the structural conversion from screw dislocation to stacking fault is promoted. However, considering the saturation of the effect, productivity, and the like, the upper limit of the thickness can be set to 10 mm.

In addition, the crystal growth rate in the first growth step is desirably 100 μm or less per hour, preferably 50 μm/hr or less, and more preferably 30 μm/hr or less. In order to make the equilibrium state described above to structurally convert screw dislocation to stacking fault, it is desirable that the crystal growth rate in the first growth step is set as described above, and as the length of the crystal growth step, it is desirable to spend a time of approximately from 1 hour to 30 hours to grow crystal. Additionally, it is desirable that the crystal growth rate in the first growth step is 1 μm/hr or more, considering productivity and the like.

The present invention includes, in addition to the first growth step, a second growth step of growing the silicon carbide single crystal to a larger thickness than in the first growth step at a second growth atmosphere pressure of from 0.13 to 2.6 kPa and a second temperature in which the temperature of the seed crystal is higher than the first growth temperature and below 2400° C. In the second growth step, the growth atmosphere pressure is made lower than that in the first growth step and the seed crystal temperature is made higher than in the first growth step to increase the crystal growth rate so as to mainly grow the silicon carbide single crystal. In other words, since screw dislocation can be structurally converted to stacking fault by the first growth step, the number of screw dislocations included in the silicon carbide single crystal grown in the second growth step is extremely reduced. In addition, by increasing the seed crystal temperature in the second growth step, a high speed growth achieving good productivity at a growth rate exceeding 100 μm/hr can be performed while obtaining a high quality silicon carbide single crystal.

The crystal growth rate in the second growth step is desirably more than 100 μm per hour, and preferably 300 μm/hr or more. In addition, the thickness of the silicon carbide single crystal grown in the second growth step is desirably 10 mm or more, in consideration of manufacturing of a silicon carbide single crystal ingot by the present invention to cut a silicon carbide single crystal substrate therefrom. Considering the use of existing equipment and the like, the upper limit of the crystal growth rate in the second growth step is approximately 1000 μm/hr. Additionally, although the upper limit of the thickness (length) of the silicon carbide single crystal grown in the second growth step is not particularly limited, the thickness thereof is approximately 200 mm, and more realistically approximately 150 mm, in consideration of performance of the present manufacturing apparatus and the like.

In addition, when switching from the first growth step to the second growth step, the pressure is reduced at a pressure changing rate of preferably 12 kPa or less per hour, more preferably 1 kPa or less per hour, and still more preferably 0.5 kPa or less per hour. The larger the changing range per a unit of time, the greater the amount of temporal change in the growth rate. Accordingly, the crystal growth during the time becomes unstable, whereby crystal defects such as the coexistence of a different polytype can occur. Thus, the pressure is desirably reduced at the pressure changing rate of 12 kPa/hr or less. In addition, by changing the pressure changing rate slowly (changing over time), the effect of the structural conversion by the first growth step can be further ensured. In other words, stacking faults can be surely expelled outside the crystal to prevent the reoccurrence of screw dislocations, thereby obtaining a silicon carbide single crystal having less screw dislocations. In view of these points, the slower the pressure changing rate, it is more desirable, but considering productivity, workability, and the like, the lower limit thereof is 0.1 kPa/hr.

For the same reason, regarding the switching of growth temperature, the temperature is increased at a temperature changing rate of preferably 40° C. or less per hour, more preferably 10° C. or less per hour, and still more preferably 5° C. or less per hour. The same consideration as the pressure changing rate can also be applied to the temperature changing rate, and the lower limit thereof is 1° C./hr.

In addition, in the present invention, in the entire growth process including the first and the second growth steps, the first growth step is preferably performed within a time of ½ or less of the entire growth process after starting the crystal growth, and is more preferably performed within a time of ⅓ or less thereof after starting the crystal growth. By causing the structural conversion of screw dislocation to take place in the initial period of crystal growth as much as possible, the region of ingot for obtaining a substrate having less screw dislocations can be increased. Thus, the above range of time for the first growth step is desirable.

Herein, at the time of starting crystal growth on the seed crystal, the first growth step may be performed for the crystal growth, and then the second growth step may be performed for the crystal growth. Alternatively, at the time of starting crystal growth, the second growth step (or a crystal growth step equivalent thereto) may be performed to grow crystal, and subsequently the first growth step may be included, then the second step may be further performed for crystal growth. As in the latter, when the first growth step is included in the middle of crystal growth, it is intended that screw dislocations included in the seed crystal are once generated in a crystal growing direction and structurally converted to stacking faults by the first growth step. Accordingly, it is desirable that the crystal is grown to a thickness of preferably 1 mm or more, more preferably 2 mm or more, followed by the first growth step. However, considering the saturation of the effect, productivity, and the like, the thickness thereof is desirably 5 mm or less. In addition, for example, when switching from the second growth step first performed to the first growth step, the pressure is increased at a pressure changing rate of desirably 12 kPa/hr or less, and the temperature is decreased at a temperature changing rate of desirably 40° C. or less.

In the present invention, since the structural conversion of screw dislocation to stacking fault is performed by controlling the growth atmosphere pressure and the growth temperature, the structural conversion is not dependent on the off angle of the seed crystal used for crystal growth in the application range thereof. However, the present inventors have confirmed that when the off angle is large, the possibility of occurrence of a different polytype increases. Therefore, the off angle of the substrate used for the seed crystal is preferably from 0 to 15 degrees, and more preferably from 0 to 8 degrees.

In addition, in the present invention, screw dislocation is reduced using the structural conversion of dislocation. Thus, there is no limitation by the polytype of a silicon carbide single crystal obtained and it is applicable as a method for obtaining silicon carbide single crystals such as 4H type as a typical polytype, 6H type, and 3C type. The reduction of screw dislocation using the structural conversion of dislocations is advantageous, particularly, in that it is applicable to the 4H type expected to be more promising as applications to power devices.

Furthermore, since the reduction of screw dislocation in the present invention is performed by controlling atmosphere pressure and growth temperature, there is no limitation to the crystal diameter of an obtained silicon carbide single crystal. Therefore, it is applicable to a process for growing a crystal having a diameter of from 50 to 300 mm expected to be most promising at present.

Still furthermore, the method for manufacturing a silicon carbide single crystal of the present invention can use a silicon carbide single crystal manufacturing apparatus using the commonly used the PVT method. Thus, for example, nitrogen doping or the like in crystal can arbitrarily be performed in accordance with the purpose of use by controlling the amount of nitrogen gas or the like supplied into a growth atmosphere using a high purity gas pipe and a mass flow controller.

The present invention can provide a silicon carbide single crystal having less screw dislocations. In other words, in the present invention, the first growth step can induce the structural conversion of screw dislocations to stacking faults and the subsequent second growth step can grow the crystal having less screw dislocations. Accordingly, a high purity silicon carbide single crystal can be obtained by reducing the density of screw dislocations included in a seed crystal to approximately ⅓ to ¹⁄₁₀ or less (in some cases, by reducing to ¹⁄₂₀ or less). More specifically, in a silicon carbide single crystal ingot obtained by the method of the present invention, the screw dislocation density represented by the number of screw dislocations per unit area in a cross-section can be made $300/cm^2$ or less, preferably $100/cm^2$ or less, and more preferably $50/cm^2$ or less. Thus, the use of a silicon carbide single crystal substrate cut from the ingot allows the formation of high performance devices in which leakage current and decrease in the life of oxide film due to screw dislocations are reduced. Particularly, the reliability of oxide film in transistors can be greatly improved.

In the present invention, the crystal growth rate is increased by switching from the first growth step to the second growth step. It is also possible to employ means for increasing the amount of sublimation of a raw material gas used in the PVT method by increasing the growth temperature to 2200° C. or more.

EXAMPLES

Hereinafter, the present invention will be described in more detail with reference to Examples and the like. The present invention is not limited the content of the Examples below.

Example A

Figure 4:
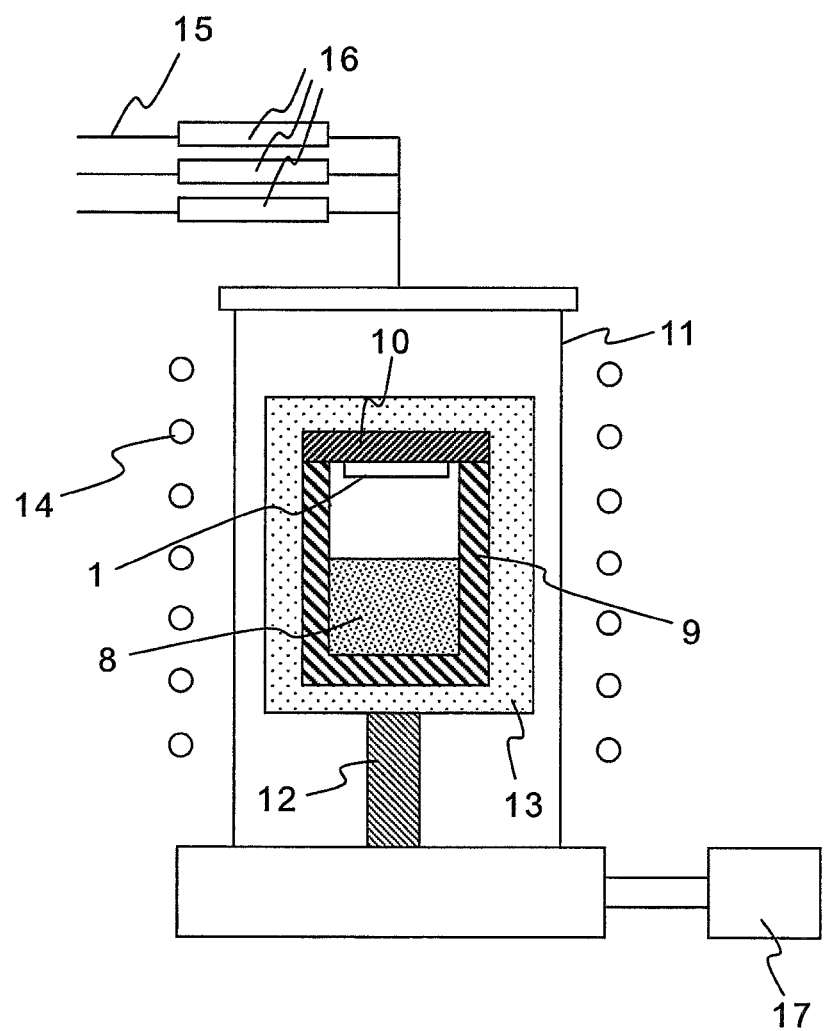
FIG. 4 is a cross-sectional schematic view depicting a single crystal manufacturing apparatus for manufacturing the bulk SiC single crystal used to obtain the SiC single crystal substrate of the present invention.

FIG. 4 depicts one example of an apparatus for growing a single crystal by a modified Lely Method (the PVT method), which is an apparatus for manufacturing a bulk SiC single crystal used to obtain a SiC single crystal substrate according to an Example of the present invention. Crystal is grown by sublimating a SiC sublimation raw material 8 by induction heating to recrystallize on a SiC seed crystal 1. The seed crystal 1 is attached onto an inner surface of a graphite lid 10, and the sublimation raw material 8 is filled in a graphite crucible 9. The graphite crucible 9 and the graphite lid 10 are covered with a graphite felt for thermal shielding and disposed on a graphite supporting rod 12 inside a double quartz tube 11. The inside of the double quartz tube 11 is vacuum evacuated by a vacuum pumping device 17 and then high purity Ar gas or nitrogen gas is flown therein through a pipe 15 while controlling by a mass flow controller 16. While regulating pressure in the quartz tube (a growth atmosphere pressure) by the vacuum pumping device 17, a high frequency current is applied to a work coil 14 to heat the graphite crucible 9 so as to perform crystal growth. Herein, growth temperature was a temperature of the SiC seed crystal 1.

Example A1

First, a 4H type SiC single crystal substrate having a main surface of a (0001) plane with a diameter of 75 mm and having an off angle inclined by 4 degrees in the (11-20) direction was cut from a SiC single crystal obtained in advance. The substrate was subjected to mirror surface polishing to prepare a seed crystal. The seed crystal 1 was attached to the inner surface of the graphite lid 10 of the apparatus for growing a single crystal described above and placed in the graphite crucible 9 filled with the sublimation raw material 8, and the crucible was covered with a graphite felt 13. The seed crystal 1 was mounted on the graphite supporting rod 12 and installed inside the double quartz tube 11.

Then, after vacuum evacuating the inside of the double quartz tube 11, high purity Ar gas as an atmosphere gas was flown therein, and while maintaining the pressure in the quartz tube at 80 kPa, the temperature of the seed crystal 1 was increased up to 2200° C. The pressure was reduced down to 3.0 kPa, which was a growth pressure, in 30 minutes, and after that, a 10-hour crystal growth was performed. Another crystal growth was performed under the same conditions to obtain measurement results. An estimate of the measurement results indicates that a SiC single crystal having a thickness of 1 mm was grown on the seed crystal by the 10-hour crystal growth (growth rate: 100 μm/h). In the crystal growth, an appropriate amount of nitrogen was introduced so as to have a nitrogen concentration of approximately $1 \times 10^{19}$ cm$^{-3}$ in the grown crystal and the amount of the nitrogen introduced was maintained until the end of the crystal growth through all growth steps including the subsequent crystal growth.

After growing the SiC single crystal (a structural conversion layer) having the thickness of 1 mm in the manner as above, subsequently, pressure was reduced at a pressure changing rate of 1.3 kPa/h and temperature was increased at a temperature changing rate of 20° C./h to provide a growth atmosphere pressure of 1.3 kPa and a seed crystal temperature of 2240° C. in two hour. Then, while maintaining the growth atmosphere pressure and the seed crystal temperature, an 80-hour crystal growth was performed. As a result, the obtained bulk SiC single crystal (ingot) had a diameter of 75 mm and a thickness (height) of 25 mm. In the crystal, the thickness of a main crystal grown portion obtained by the 80-hour crystal growth is assumed to be 24 mm from an estimate of results measured under the same conditions (growth rate: 300 μm/h).

In the bulk SiC single crystal obtained above, a (0001) plane substrate was cut from a main crystal grown portion positioned at a height of approximately 20 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Example A1.

Figure 3:
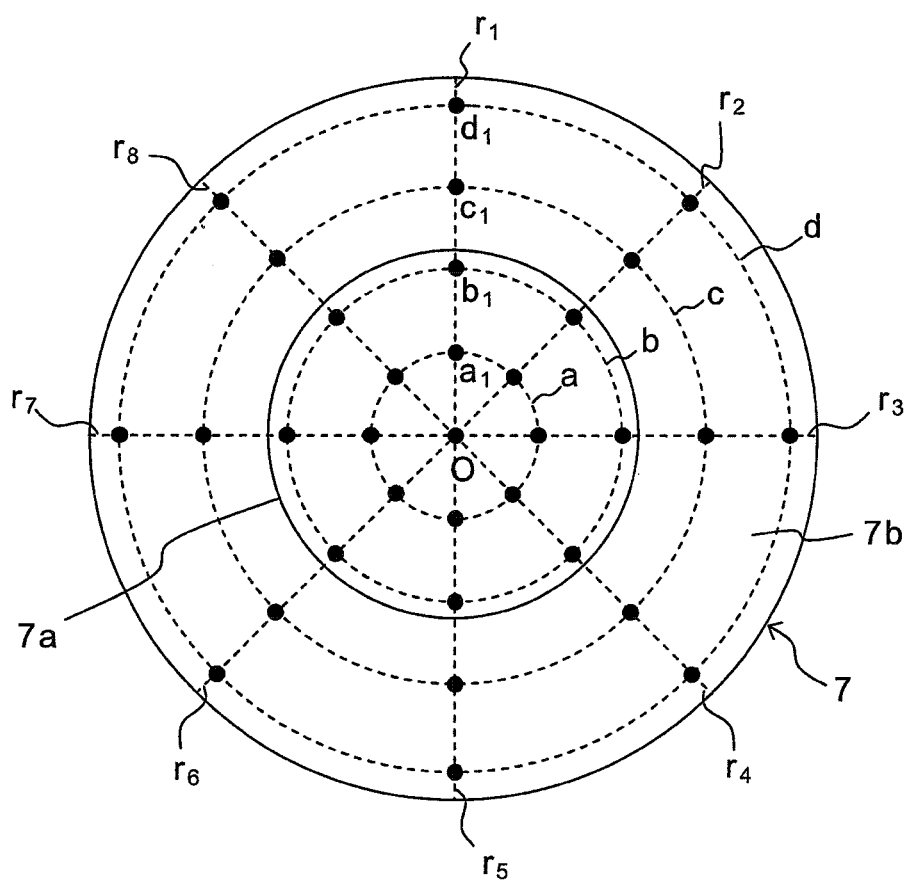
FIG. 3 is a plan schematic view depicting one example of measurement points selected when obtaining respective average values of screw dislocation densities observed in the center circle region and the doughnut-shaped peripheral region of the SiC single crystal substrate.

The SiC single crystal substrate was immersed in a molten KOH at 520° C. for 5 minutes such that the entire surface of the substrate was immersed, so as to perform etching with the molten KOH. The (0001) plane of the substrate subjected to the etching was observed through an optical microscope (magnification: 80 times) to measure a screw dislocation density. Herein, in accordance with a method described in J. Takahashi et al., Journal of Crystal Growth, 135, (1994), 61-70, a shell-shaped pit was defined as a basal plane dislocation, a small-sized round pit was defined as a threading edge dislocation, and middle-sized and large-sized hexagonal pits were defined as screw dislocations to classify dislocation defects by etch-pit configurations and obtain a screw dislocation density. In addition, in the observation through the optical microscope, as explained in FIG. 3 above, the total 33 measurement points (the center point O, $a_1$ to $a_8$, $b_1$ to $b_8$, $c_1$ to $c_8$, and $d_1$ to $d_8$) were selected. At that time, in each radius, a was set to a position of 0.2 at scale (radius×0.2), b was set to a position of 0.4 at scale (radius×0.4), c was set to a position of 0.6 at scale (radius×0.6), and d was set to a position of 0.8 at scale (radius×0.8). The number of screw dislocations in a region of 4 mm×3 mm around each measurement point as a center was measured to obtain a screw dislocation density at each measurement point.

Table 1 indicates the results.

TABLE 1

| Measurement point (unit:/cm$^2$) | | Example A1 | Example A2 | Example A3 |
|---|---|---|---|---|
| i) | Center point O | 908 | 1076 | 1284 |
| ii) | $a_1, a_2, a_3, a_4,$ $a_5, a_6, a_7, a_8$ | 636, 308, 376, 224, 436, 868, 904, 304 | 992, 632, 552, 648, 854, 820, 978, 1086 | 1144, 1068, 560, 636, 992, 820, 1352, 1192 |
| iii) | $b_1, b_2, b_3, b_4,$ $b_5, b_6, b_7, b_8$ | 600, 644, 836, 544, 1004, 460, 1028, 204 | 1046, 716, 1052, 598, 786, 740, 894, 1192 | 740, 716, 292, 360, 796, 912, 1100, 792 |
| iv) | $c_1, c_2, c_3, c_4,$ $c_5, c_6, c_7, c_8$ | 354, 608, 318, 495, 376, 584, 462, 468 | 256, 408, 524, 366, 354, 452, 444, 268 | 52, 868, 534, 444, 716, 484, 336, 268 |
| v) | $d_1, d_2, d_3, d_4,$ $d_5, d_6, d_7, d_8$ | 426, 316, 372, 528, 452, 346, 568, 752 | 380, 700, 484, 360, 856, 352, 658, 396 | 380, 700, 416, 360, 48, 308, 136, 144 |
| Average of total 17 measurement points of i) to iii) | | 605 | 862 | 868 |
| Average of total 16 measurement points of iv) to v) | | 464 | 454 | 387 |

As indicated in Table 1, when values measured at 17 total measurement points (the center point O, $a_1$ to $a_8$, and $b_1$ to $b_8$) of i) to iii) included in the center circle region 7a having a diameter of 0.5×R centered around the center point O of the substrate as the center were averaged, the average value of screw dislocation densities observed in the center circle region 7a was 605/cm$^2$. On the other hand, when values measured at 16 total measurement points ($c_1$ to $c_8$ and $d_1$ to $d_8$) of iv) to v) included in the doughnut-shaped peripheral region 7b remaining by excluding the center circle region 7a were averaged, the average value of screw dislocation densities observed in the doughnut-shaped peripheral region 7b was 464/cm$^2$, which was 80% or less of the average value of the screw dislocation densities observed in the center circle region.

In addition, in the bulk of the SiC single crystal remaining after cutting the SiC single crystal substrate, a (1-100) plane substrate was cut from a crystal including the seed crystal. The (1-100) plane substrate was immersed in a molten KOH at 520° C. for 5 minutes to perform etching with the molten KOH, and then the surface of the etched substrate was observed through an optical microscope (magnification: 100 times). As a result, in the SiC single crystal portion (the structural conversion layer) having the thickness of 1 mm first grown on the seed crystal, linear etching marks extending substantially perpendicularly to the growing direction were observed and the occurrence of a large number of stacking faults was found. In particular, starting points of the occurrence of the stacking faults concentrated in the peripheral region of the bulk SiC single crystal.

Then, the region where the stacking faults occurred was observed by high resolution x-ray topography. In the observation, the (0004) plane was used as a diffraction plane. As a result, the X-ray topographic image showed defects extending substantially perpendicularly to the growing direction in the seed crystal 1 and the SiC single crystal portion having the thickness of 1 mm on the seed crystal 1. From the relationship with the observation condition (transmission (0004)), the defects can be identified as crystal defects whose Burgers vector includes a component of <000n>. In other words, screw dislocations were confirmed to have been converted to the defects extending substantially perpendicularly to the growing direction. The points of occurrence of the defects match with the positions of stacking faults observed in the molten KOH etching, indicating that the SiC single crystal having the height of 1 mm grown on the seed crystal served as the structural conversion layer so that the screw dislocations were structurally converted to the stacking faults.

Example A2

First, after vacuum evacuating the inside of the double quartz tube 11, high purity Ar gas as an atmosphere gas was flown therein and the temperature of the seed crystal 1 was increased to 2200° C. while maintaining the pressure in the quartz tube at 80 kPa. After that, the pressure was reduced down to 6.5 kPa as a growth pressure in 30 minutes and a 10-hour crystal growth was performed under the growth conditions of the in-quartz tube pressure of 6.5 kPa and the temperature of the seed crystal 1 of 2200° C., thereby growing a structural conversion layer made of a SiC single crystal having a thickness of 0.8 mm on the seed crystal (growth rate: 80 μm/h). Subsequently, the pressure was reduced down at a pressure changing rate of 1.3 kPa/h and the temperature was increased at a temperature changing rate of 25° C./h to provide an in-quartz tube pressure of 1.3 kPa and a seed crystal temperature of 2300° C. in 4 hours. Then, a bulk SiC single crystal was obtained in the same manner as Example A1, except that an 80-hour crystal growth was performed while maintaining the growth atmosphere pressure and the seed crystal temperature above.

As a result, the obtained bulk SiC single crystal (ingot) had a diameter of 75 mm and a thickness (height) of 24.8 mm. In the crystal, the thickness of a main crystal grown portion obtained by the 80-hour crystal growth is assumed to be 24 mm from an estimate of results measured under the same conditions (growth rate: 300 μm/h).

In the bulk SiC single crystal obtained above, a (0001) plane substrate was cut from a main crystal grown portion positioned at a height of approximately 20 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Example A2.

The SiC single crystal substrate obtained above was subjected to molten KOH etching in the same manner as Example A1 and the (0001) plane of the etched substrate was observed through an optical microscope to obtain a screw dislocation density. Selection of measurement points and measurement of the screw dislocation density were also performed in the same manner as those in Example A1.

Table 1 indicates the results.

As indicated in Table 1, when values measured at the total 17 measurement points of i) to iii) included in the center circle region 7a are averaged, the average value of screw dislocations observed in the center circle region 7a is $862/cm^2$. On the other hand, when values measured at the total 16 measurement points of iv) to v) included in the doughnut-shaped peripheral region 7b are averaged, the average value of screw dislocation densities observed in the doughnut-shaped peripheral region 7b was $454/cm^2$, which was 60% or less of the average value of the screw dislocation densities observed in the center circle region.

In addition, in the bulk of the SiC single crystal remaining after cutting the SiC single crystal substrate of Example A2, a (1-100) plane substrate was cut from a crystal including the seed crystal. Then, molten KOH etching was performed in the same manner as Example A1 and the surface of the etched substrate was observed through an optical microscope. As a result, similarly to Example A1, in the SiC single crystal portion (a structural conversion layer) having the thickness of 1 mm first grown on the seed crystal, linear etching marks extending substantially perpendicularly to the growing direction were observed and the occurrence of a large number of stacking faults was found. Particularly, starting points of the occurrence of the stacking faults concentrated in the peripheral region of the bulk SiC single crystal.

In addition, the region where the stacking faults occurred was observed by high resolution x-ray topography in the same manner as Example A1. As a result, from the X-ray topographic image, almost similarly to the case of Example A1, screw dislocations were confirmed to have been converted to defects extending substantially perpendicularly to the growing direction. Thus, in the case of Examples A2 also, it seems that the SiC single crystal having the height of 1 mm grown on the seed crystal 1 served as the structural conversion layer, thereby structurally converting the screw dislocations to the stacking faults.

Example A3

First, after vacuum evacuating the inside of the double quartz tube 11, high purity Ar gas as an atmosphere gas was flown therein and the temperature of the seed crystal 1 was increased to 2200° C. while maintaining the pressure in the quartz tube at 80 kPa. After that, the pressure was reduced down to 13.3 kPa as a growth pressure in 30 minutes and a 20-hour crystal growth was performed under the growth conditions of the in-quartz tube pressure of 13.3 kPa and the temperature of seed crystal 1 of 2200° C., thereby growing a structural conversion layer made of a SiC single crystal having a thickness of 0.8 mm on the seed crystal (growth rate: 50 μm/h). Subsequently, the pressure was reduced down at a pressure changing rate of 1.2 kPa/h and the temperature was increased at a temperature changing rate of 10° C./h to provide an in-quartz tube pressure of 1.3 kPa and a seed crystal temperature of 2300° C. in 10 hours. Then, a bulk SiC single crystal was obtained in the same manner as Example A1, except that an 80-hour crystal growth was performed while maintaining the growth atmosphere pressure and the seed crystal temperature above.

As a result, the obtained bulk SiC single crystal (ingot) had a diameter of 75 mm and a thickness (height) of 25 mm. In the crystal, the thickness of a main crystal grown portion obtained by the 80-hour crystal growth is assumed to be 24 mm from an estimate of results measured under the same conditions (growth rate: 300 μm/h).

In the bulk SiC single crystal obtained above, a (0001) plane substrate was cut from a main crystal grown portion positioned at a height of approximately 20 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Example A3.

The SiC single crystal substrate obtained above was subjected to molten KOH etching in the same manner as Example A1 and the (0001) plane of the etched substrate was observed through an optical microscope to obtain a screw dislocation density. Selection of measurement points and measurement of the screw dislocation density were also performed in the same manner as those in Example A1.

Table 1 indicates the results.

As indicated in Table 1, when values measured at the total 17 measurement points of i) to iii) included in the center circle region 7a are averaged, the average value of screw dislocations observed in the center circle region 7a is 868/cm². On the other hand, when values measured at the total 16 measurement points of iv) to v) included in the doughnut-shaped peripheral region 7b are averaged, the average value of screw dislocation densities observed in the doughnut-shaped peripheral region 7b was 387/cm², which was ½ or less of the average value of the screw dislocation densities observed in the center circle region.

Example A4

First, after vacuum evacuating the inside of the double quartz tube 11, high purity Ar gas as an atmosphere gas was flown therein and the temperature of the seed crystal 1 was increased to 2200° C. while maintaining the pressure in the quartz tube at 80 kPa. After that, the pressure was reduced down to 26.6 kPa as a growth pressure in 30 minutes and a 30-hour crystal growth was performed under the growth conditions of the in-quartz tube pressure of 26.6 kPa and the temperature of seed crystal 1 of 2200° C. to grow a structural conversion layer made of a SiC single crystal having a thickness of 0.75 mm on the seed crystal (growth rate: 25 μm/h). Subsequently, the pressure was reduced down at a pressure changing rate of 1.265 kPa/h and the temperature was increased at a temperature changing rate of 5° C./h to provide an in-quartz tube pressure of 1.3 kPa and a seed crystal temperature of 2300° C. in 20 hours. Then, a bulk SiC single crystal was obtained in the same manner as Example A1, except that an 80-hour crystal growth was performed while maintaining the growth atmosphere pressure and the seed crystal temperature above.

As a result, the obtained bulk SiC single crystal (ingot) had a diameter of 75 mm and a thickness (height) of 24.75 mm. In the crystal, the thickness of a main crystal grown portion obtained by the 80-hour crystal growth is assumed to be 24 mm from an estimate of results measured under the same conditions (growth rate: 300 μm/h).

In the bulk SiC single crystal obtained above, a (0001) plane substrate was cut from a main crystal grown portion positioned at a height of approximately 20 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Example A4.

The SiC single crystal substrate obtained above was subjected to molten KOH etching in the same manner as Example A1 and the (0001) plane of the etched substrate was observed through an optical microscope to obtain a screw dislocation density. Selection of measurement points and measurement of the screw dislocation density were also performed in the same manner as those in Example A1.

Table 2 indicates the results.

TABLE 2

| Measurement points (unit:/cm²) | | Example A4 | Example A5 | Comparative Example A1 |
|---|---|---|---|---|
| i) | Center point O | 1480 | 986 | 652 |
| ii) | $a_1, a_2, a_3, a_4,$ $a_5, a_6, a_7, a_8$ | 1744, 808, 876, 624, 660, 836, 1736, 192 | 982, 648, 1146, 652, 864, 812, 956, 962 | 1520, 816, 552, 600, 308, 592 1152, 1804 |
| iii) | $b_1, b_2, b_3, b_4,$ $b_5, b_6, b_7, b_8$ | 600, 1044, 1136, 544, 2004, 1428, 1968, 204 | 852, 1100, 1068, 742, 884, 1052, 522, 1058 | 1996, 1008, 900, 568, 560, 1068, 1520, 484 |
| iv) | $c_1, c_2, c_3, c_4,$ $c_5, c_6, c_7, c_8$ | 76, 600, 616, 360, 268, 60, 292, 36 | 92, 108, 26, 204, 98, 28, 108, 64 | 1496, 668, 716, 584, 892, 608, 1728, 752 |
| v) | $d_1, d_2, d_3, d_4,$ $d_5, d_6, d_7, d_8$ | 468, 792, 116, 528, 8, 32, 68, 192 | 88, 228, 94, 62, 66, 26, 102, 84 | 1392, 608, 836, 484, 836, 476, 1384, 592 |
| Average of total 17 measurement points of i) to iii) | | 1052 | 899 | 947 |
| Average of total 16 measurement points of iv) to v) | | 282 | 92 | 878 |

As indicated in Table 2, when values measured at total 17 measurement points of i) to iii) included in the center circle region 7a were averaged, the average value of screw dislocation densities observed in the center circle region 7a is 1052/cm². On the other hand, when values measured at total 16 measurement points of iv) to v) included in the doughnut-shaped peripheral region 7b remaining by excluding the center circle region 7a were averaged, the average value of screw dislocation densities observed in the doughnut-shaped peripheral region 7b is 282/cm², which was ⅓ or less of the average value of the screw dislocation densities observed in the center circle region.

Example A5

First, after vacuum evacuating the inside of the double quartz tube 11, high purity Ar gas as an atmosphere gas was flown therein and the temperature of the seed crystal 1 was increased to 2200° C. while maintaining the pressure in the quartz tube at 80 kPa. After that, the pressure was reduced down to 39.9 kPa as a growth pressure in 30 minutes and a 50-hour crystal growth was performed under the growth conditions of the in-quartz tube pressure of 39.9 kPa and the temperature of seed crystal 1 of 2200° C. to grow a structural conversion layer made of a SiC single crystal having a thickness of 0.75 mm on the seed crystal (growth rate: 15 μm/h). Subsequently, the pressure was reduced down at a pressure changing rate of 1.29 kPa/h and the temperature was increased at a temperature changing rate of 3.3° C./h to provide an in-quartz tube pressure of 1.3 kPa and a seed crystal temperature of 2300° C. in 30 hours. Then, a bulk SiC single crystal was obtained in the same manner as Example A1, except that an 80-hour crystal growth was performed while maintaining the growth atmosphere pressure and the seed crystal temperature above.

As a result, the obtained bulk SiC single crystal (ingot) had a diameter of 75 mm and a thickness (height) of 24.75 mm. In the crystal, the thickness of a main crystal grown portion obtained by the 80-hour crystal growth is assumed to be 24 mm from an estimate of results measured under the same conditions (growth rate: 300 μm/h).

In the bulk SiC single crystal obtained above, a (0001) plane substrate was cut from a main crystal grown portion positioned at a height of approximately 20 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Example A5.

The SiC single crystal substrate obtained above was subjected to molten KOH etching in the same manner as Example A1 and the (0001) plane of the etched substrate was observed through an optical microscope to obtain a screw dislocation density. Selection of measurement points and measurement of the screw dislocation density were also performed in the same manner as those in Example A1.

Table 2 indicates the results.

As indicated in Table 2, when values measured at total 17 measurement points of i) to iii) included in the center circle region 7a were averaged, the average value of screw dislocation densities observed in the center circle region 7a is 899/cm$^2$. On the other hand, when values measured at total 16 measurement points of iv) to v) included in the doughnut-shaped peripheral region 7b remaining by excluding the center circle region 7a were averaged, the average value of screw dislocation densities observed in the doughnut-shaped peripheral region 7b is 92/cm$^2$, which was approximately 1/10 of the average value of the screw dislocation densities observed in the center circle region.

Comparative Example A1

The inside of the double quartz tube 11 was vacuum evacuated similarly to Example A1. After that, high purity Ar gas as an atmosphere gas was flown therein and the pressure in the quartz tube was set to 80 kPa. Under the pressure, electric current was applied to the work coil 14 to increase the temperature so as to increase the temperature of the seed crystal 1 up to 2200° C. The pressure was reduced down to 1.3 kPa as a growth pressure in 30 minutes. Then, a 100-hour crystal growth was performed to grow a bulk SiC single crystal having a diameter of 75 mm and a thickness (height) of 30 mm (growth rate: 300 μm).

In the bulk SiC single crystal obtained above, a (0001) plane substrate was cut from a main crystal grown portion positioned at a height of approximately 25 mm when the seed crystal side was regarded as a bottom surface and polished to a surface roughness Ra of approximately 1 nm by diamond polishing to obtain a SiC single crystal substrate having a thickness of 400 μm and a diameter of 75 mm according to Comparative Example A1.

The SiC single crystal substrate obtained above was subjected to molten KOH etching in the same manner as Example A1 and the (0001) plane of the etched substrate was observed through an optical microscope to obtain a screw dislocation density. Selection of measurement points and measurement of the screw dislocation density were also performed in the same manner as those in Example A1.

Table 2 indicates the results.

As indicated in Table 2, when values measured at total 17 measurement points of i) to iii) included in the center circle region 7a were averaged, the average value of screw dislocation densities observed in the center circle region 7a of the SiC single crystal substrate according to Comparative Example A1 is 947/cm$^2$. On the other hand, when values measured at total 16 measurement points of iv) to v) included in the doughnut-shaped peripheral region 7b are averaged, the average value of screw dislocation densities observed in the doughnut-shaped peripheral region 7b is 878/cm$^2$, so that the center circle region 7a and doughnut-shaped peripheral region 7b had similar values.

Then, in the bulk of the SiC single crystal remaining after cutting the SiC single crystal substrate of Comparative Example A1, a (1-100) plane substrate was cut from a crystal including the seed crystal. The substrate was subjected to molten KOH etching, similarly to Example A1 and the surface of the etched substrate was observed through an optical microscope. As a result, no stacking faults as observed in Examples A1 and 2 were particularly found and thus the structural conversion of screw dislocations was not observed.

Hereinafter, another embodiment of the present invention will be described in detail based on Example B.

The Example B used, as in Example A, used the apparatus for growing a single crystal by the modified Rayleigh Method in FIG. 4.

[Experiment for Confirming Structural Conversion by First Growth Step]

First, a 4H type SiC single crystal substrate having a main surface of (0001) plane with a diameter of 75 mm and having an off angle inclined by 4 degrees in the (11-20) direction was cut from a SiC single crystal obtained in advance. The substrate was subjected to mirror surface polishing to prepare a seed crystal. In addition, another (0001) plane substrate was cut from the same SiC single crystal and subjected to mirror surface polishing. Then, molten KOH etching (at 520° C. for 5 to 10 minutes) was performed and a screw dislocation density was measured by an optical microscope. Herein, in accordance with the method described in J. Takahashi et al., Journal of Crystal Growth, 135, (1994), 61-70, a shell-shaped pit was defined as a basal plane dislocation, a small-sized round pit was defined as a threading edge dislocation, and middle-sized and large-sized hexagonal pits were defined as screw dislocations to classify dislocation defects by etch-pit configurations and obtain a screw dislocation density of 1000/cm$^2$.

The seed crystal 1 was attached to the inner surface of the graphite lid 4 of the apparatus for growing a single crystal described above and placed in the graphite crucible container 9 filled with the sublimation raw material 8, and the container was covered with a graphite felt 13. The seed crystal 1 was mounted on the graphite supporting rod 12 and installed inside the double quartz tube 11. Then, after vacuum evacuating the inside of the double quartz tube 11, high purity Ar gas as an atmosphere gas was flown therein to set the pressure in the quartz tube to 80 kPa. Under the pressure, electric current was applied to the work coil to increase the temperature so as to increase the temperature of the seed crystal 1 up to 2200° C. After that, the pressure was reduced down to 13.3 kPa as a growth pressure in 30 minutes to start crystal growth. Hereinbelow, including Examples B and Comparative Example B, through all the growth steps, the amount of nitrogen flown was set to 0.01 L/min (at the flow rate, the concentration of nitrogen in the grown crystal is approximately $1 \times 10^{19}$ cm$^{-3}$), which was maintained until the end of the crystal growth.

First, by performing a 20-hour crystal growth under the conditions of the growth atmosphere pressure and the seed crystal temperature above, the growth of a silicon carbide single crystal having a diameter of 50 mm and a height of 1 mm was confirmed (the first growth step). A (0001) plane substrate was cut from the obtained crystal and subjected to mirror surface polishing. Then, molten KOH etching (at 520° C. for 5 to 10 minutes) was performed to measure a screw dislocation density by the method described above at arbitrary four points in the peripheral region of the substrate. The average of the densities obtained was 100/cm$^2$.

In addition, separately, a (1-100) plane substrate of the crystal was cut and subjected to mirror surface polishing. Then, molten KOH etching was performed to observe through an optical microscope. Linear etching marks extending substantially perpendicularly to the growing direction were observed and the occurrence of a large number of stacking faults was found. The region having the stacking faults was observed by high resolution x-ray topography. In the observation, the (0004) plane was defined as a diffraction plane. The x-ray topographic image showed defects extending in parallel to the growing direction in the seed crystal and the growth initial period region immediately on the seed crystal. From the relationship with the observation condition (transmission (0004)), the defects can be identified as dislocation defects including screw dislocation components of which Burgers vector is <0001>. In other words, it is indicated that the screw dislocations have been converted to the defects extending substantially perpendicularly to the growing direction, and at the same time, since the places of occurrence of the defects match with positions of the stacking faults observed in the molten KOH etching, the screw dislocations are indicated to have been converted to the stacking faults.

Furthermore, separately, a (1-100) plane substrate of the crystal was cut and subjected to mirror surface polishing. Then, the substrate was observed by high resolution x-ray topography, whereby a plurality of pieces of screw dislocations converted to stacking faults were observed. The screw dislocations do not penetrate through the substrate in the <0001> direction. Accordingly, if any device is formed from the substrate, it seems possible to reduce leakage current and improve formation failure of oxide film.

Example B1

First, a structural conversion inducing growth was performed in the same manner as the experiment for confirming the structural conversion (Step I). Next, the pressure was reduced at a pressure changing rate of 1.2 kPa/hr and the temperature was increased at a temperature changing rate of 10° C./hr to provide a growth atmosphere pressure of 1.3 kPa and a seed crystal temperature of 2300° C. in 10 hours (transition conditions: Step II), and while maintaining the growth atmosphere pressure and the seed crystal temperature above, a 30-hour crystal growth was performed (normal growth: Step III). The obtained silicon carbide single crystal (ingot) had a diameter of 50 mm and a thickness (entire length) of 13 mm. In the crystal, the thickness of the single crystal grown by the step III is assumed to be 11 mm from an estimate of results measured under the same conditions.

A (0001) plane substrate was cut from the single crystal portion grown by the step III and subjected to mirror surface polishing. Then, molten KOH etching (at 520° C. for 5 to 10 minutes) was performed and screw dislocation densities were measured through an optical microscope by the method described above at arbitrary four points in the peripheral region of the substrate. The average value obtained was 110/cm$^2$. In other words, it was confirmed that, as compared to the value in the seed crystal, the screw dislocation density was significantly reduced. These results and the like are all together indicated in Table 3.

TABLE 3

| | Step I<br>Structural conversion induced growth | Step II<br>Transition conditions | Step III<br>Normal growth | Screw dislocation density |
|---|---|---|---|---|
| Example B1 | Pressure: 13.3 kPa<br>Temperature: 2200° C.<br>Thickness: 1 mm<br>Growth rate: 50 μm/h | Pressure change: 1.2 kPa/h<br>Temperature change: 10° C./h<br>Transition time: 10 h | Pressure: 1.3 kPa<br>Temperature: 2300° C.<br>Thickness: 11 mm | 110/cm$^2$ |
| Example B2 | Pressure: 6.65 kPa<br>Temperature: 2100° C.<br>Thickness: 1 mm<br>Growth rate: 90 μm/h | Pressure change: 0.54 kPa/h<br>Temperature change: 10° C./h<br>Transition time: 10 h | Pressure: 1.3 kPa<br>Temperature: 2200° C.<br>Thickness: 11 mm | 260/cm$^2$ |
| Example B3 | Pressure: 26.6 kPa<br>Temperature: 2100° C.<br>Thickness: 1 mm<br>Growth rate: 30 μm/h | Pressure change: 1.3 kPa/h<br>Temperature change: 5° C./h<br>Transition time: 20 h | Pressure: 1.3 kPa<br>Temperature: 2200° C.<br>Thickness: 11 mm | 45/cm$^2$ |
| Example B4 | Pressure: 13.3 kPa<br>Temperature: 2200° C.<br>Thickness: 0.5 mm<br>Growth rate: 50 μm/h | Pressure change: 1.2 kPa/h<br>Temperature change: 20° C./h<br>Transition time: 10 h | Pressure: 1.3 kPa<br>Temperature: 2400° C.<br>Thickness: 11 mm | 280/cm$^2$ |
| Example B5 | Pressure: 6.65 kPa<br>Temperature: 2100° C.<br>Thickness: 1 mm<br>Growth rate: 90 μm/h | Pressure change: 0.27 kPa/h<br>Temperature change: 5° C./h<br>Transition time: 20 h | Pressure: 1.3 kPa<br>Temperature: 2200° C.<br>Thickness: 10 mm | 120/cm$^2$ |
| Example B6 | Pressure: 13.3 kPa<br>Temperature: 2200° C.<br>Thickness: 1 mm<br>Growth rate: 50 μm/h | Pressure change: 0.2 kPa/h<br>Temperature change: 1.67° C./h<br>Transition time: 60 h | Pressure: 1.3 kPa<br>Temperature: 2300° C.<br>Thickness: 9 mm | 40/cm$^2$ |
| Example B7 | Pressure: 13.3 kPa<br>Temperature: 2250° C.<br>Thickness: 1 mm<br>Growth rate: 40 μm/h | Pressure change: 1.2 kPa/h<br>Temperature change: 5° C./h<br>Transition time: 10 h | Pressure: 1.3 kPa<br>Temperature: 2300° C.<br>Thickness: 11 mm | 40/cm$^2$ |
| Example B8 | Pressure: 6.65 kPa<br>Temperature: 2100° C.<br>Thickness: 2.7 mm<br>Growth rate: 90 μm/h | Pressure change: 0.54 kPa/h<br>Temperature change: 10° C./h<br>Transition time: 0 h | Pressure: 1.3 kPa<br>Temperature: 2200° C.<br>Thickness: 10 mm | 40/cm$^2$ |

TABLE 3-continued

|  | Step I<br>Structural conversion<br>induced growth | Step II<br>Transition conditions | Step III<br>Normal growth | Screw dislocation<br>density |
|---|---|---|---|---|
| Comparative<br>Example B1 | Pressure: 2.6 kPa<br>Temperature: 2200° C.<br>Thickness: 1 mm<br>Growth rate: 200 μm/h | Pressure change: 1.3 kPa/h<br>Temperature change: 0° C./h<br>Transition time: 1 h | Pressure: 1.3 kPa<br>Temperature: 2200° C.<br>Thickness: 11 mm | 900/cm$^2$ |
| Comparative<br>Example B2 | Pressure: 13.3 kPa<br>Temperature: 2000° C.<br>Thickness: 0.5 mm<br>Growth rate: 20 μm/h | Pressure change: 1.2 kPa/h<br>Temperature change: 20° C./h<br>Transition time: 10 h | Pressure: 1.3 kPa<br>Temperature: 2200° C.<br>Thickness: 11 mm | 800/cm$^2$ |
| Comparative<br>Example B3 | Pressure: 13.3 kPa<br>Temperature: 2200° C.<br>Thickness: 0.2 mm<br>Growth rate: 50 μm/h | Pressure change: 1.2 kPa/h<br>Temperature change: 10° C./h<br>Transition time: 10 h | Pressure: 1.3 kPa<br>Temperature: 2300° C.<br>Thickness: 12 mm | 800 cm$^2$ |
| Comparative<br>Example B4 | Pressure: 26.6 kPa<br>Temperature: 2200° C.<br>Thickness: 0.2 mm<br>Growth rate: 30 μm/h | Pressure change: 25.3 kPa/h<br>Temperature change: 100° C./h<br>Transition time: 1 h | Pressure: 1.3 kPa<br>Temperature: 2300° C.<br>Thickness: 12 mm | 1400/cm$^2$<br>Occurrence of different<br>polytype and micropipe<br>in step II. |

Examples B2 to 8, Comparative Examples B1 to 4

As indicated in Table 3, the growth of a silicon carbide single crystal was performed in the same manner as Example B1, except that the respective conditions in the steps I, II, and III were changed. In addition, among the finally obtained silicon carbide single crystals, a (0001) plane substrate was cut from the single crystal portion grown by the step III to obtain a screw dislocation density in the same manner as Example B1. Table 3 indicates the results.

As seen from the results indicated in Table 3, in all the cases of Examples B according to the present invention, as compared to Comparative Examples B, the screw dislocation density was greatly reduced. In addition to that, in Example B4, co-existence of a different polytype, which was not found in Examples B, was observed, as well as the occurrence of micropipe was also confirmed.

Examples B9 to 14, Comparative Example B

Using a seed crystal substantially equivalent (screw dislocation density: 1000/cm$^2$) to that of Example B1, crystal growth consisting of growth steps indicated in Table 4 was performed.

First, as indicated as Step I, the growth atmosphere pressure and the seed crystal temperature, respectively, at a time of starting growth were set to 1.3 kPa and 2200° C., respectively, to perform a 20-hour crystal growth so as to grow a silicon carbide single crystal having a thickness of 4 mm. Subsequently, at a pressure changing rate and a temperature changing rate indicated in step II, the growth conditions were changed in 1 to 10 hours, and then, while maintaining a growth atmosphere pressure and a seed crystal temperature indicated in step III, a structural conversion induced growth was performed for 10 to 33.3 hours. Additionally, at a pressure changing rate and a temperature changing rate indicated in step IV, the growth conditions were changed in 1 to 60 hours, and finally, while maintaining a growth atmosphere pressure and a seed crystal temperature indicated in step V, a 30-hour crystal growth was performed. The thickness and the crystal growth rates of a crystal obtained in step III corresponding to the first growth step of the present invention are as given in Table 4. These values were estimated from results obtained by separately performing the same growth. In addition, the thickness of a single crystal grown by step V corresponding to the second growth step is 9 to 12 mm and the growth rate thereof is 300 to 400 μm/hr.

A (0001) plane substrate was cut from each of single crystal portions grown by step V above and subjected to mirror surface polishing. Then, molten KOH etching (at 520° C. for 5 to 10 minutes) was performed on the substrate to measure a screw dislocation density through an optical microscope by the method described above. Table 4 indicates the results.

TABLE 4

|  | Step I<br>Normal growth | Step II<br>transition<br>conditions | Step III<br>Structural<br>conversion induced<br>growth | Step IV<br>transition<br>conditions | Step V<br>Normal growth | Screw<br>dislocation<br>density |
|---|---|---|---|---|---|---|
| Example B9 | Pressure: 1.3 kPa<br>Temperature:<br>2200° C.<br>Thickness: 4 mm | Pressure<br>change: 1.2 kPa/h<br>Temperature<br>change: 0° C./h<br>Transition<br>time: 10 h | Pressure: 13.3 kPa<br>Temperature: 2200° C.<br>Thickness: 1 mm<br>Growth rate: 50 μm/h | Pressure change:<br>1.2 kPa/h<br>Temperature<br>change: 5° C./h<br>Transition time:<br>10 h | Pressure: 1.3 kPa<br>Temperature:<br>2250° C.<br>Thickness: 11 mm | 120/cm$^2$ |
| Example B10 | Pressure: 1.3 kPa<br>Temperature:<br>2200° C.<br>Thickness: 4 mm | Pressure<br>change: 2.5 kPa/h<br>Temperature<br>change: 0° C./h<br>Transition<br>time: 10 h | Pressure: 26.6 kPa<br>Temperature: 2200° C.<br>Thickness: 1 mm<br>Growth rate: 30 μm/h | Pressure change:<br>2.5 kPa/h<br>Temperature<br>change: 10° C./h<br>Transition time:<br>10 h | Pressure: 1.3 kPa<br>Temperature:<br>2300° C.<br>Thickness: 11 mm | 50/cm$^2$ |

TABLE 4-continued

|  | Step I<br>Normal growth | Step II<br>transition<br>conditions | Step III<br>Structural<br>conversion induced<br>growth | Step IV<br>transition<br>conditions | Step V<br>Normal growth | Screw<br>dislocation<br>density |
|---|---|---|---|---|---|---|
| Example B11 | Pressure: 1.3 kPa<br>Temperature:<br>2200° C.<br>Thickness: 4 mm | Pressure<br>change: 2.5 kPa/h<br>Temperature<br>change: 0° C./h<br>Transition<br>time: 10 h | Pressure: 26.6 kPa<br>Temperature: 2200° C.<br>Thickness: 0.5 mm<br>Growth rate: 30 μm/h | Pressure change:<br>2.5 kPa/h<br>Temperature<br>change: 10° C./h<br>Transition time:<br>10 h | Pressure: 1.3 kPa<br>Temperature:<br>2300° C.<br>Thickness: 12 mm | 210/cm$^2$ |
| Example B12 | Pressure: 1.3 kPa<br>Temperature:<br>2200° C.<br>Thickness: 4 mm | Pressure<br>change: 1.2 kPa/h<br>Temperature<br>change: 0° C./h<br>Transition<br>time: 10 h | Pressure: 13.3 kPa<br>Temperature: 2200° C.<br>Thickness: 1 mm<br>Growth rate: 50 μm/h | Pressure change:<br>0.2 kPa/h<br>Temperature<br>change: 0.83° C./h<br>Transition time:<br>10 h | Pressure: 1.3 kPa<br>Temperature:<br>2250° C.<br>Thickness: 9 mm | 45/cm$^2$ |
| Example B13 | Pressure: 1.3 kPa<br>Temperature:<br>2200° C.<br>Thickness: 4 mm | Pressure<br>change: 1.2 kPa/h<br>Temperature<br>change: 5° C./h<br>Transition<br>time: 10 h | Pressure: 13.3 kPa<br>Temperature: 2250° C.<br>Thickness: 1 mm<br>Growth rate: 40 μm/h | Pressure change:<br>1.2 kPa/h<br>Temperature<br>change: 5° C./h<br>Transition time:<br>10 h | Pressure: 1.3 kPa<br>Temperature:<br>2300° C.<br>Thickness: 11 mm | 40/cm$^2$ |
| Example B14 | Pressure: 1.3 kPa<br>Temperature:<br>2200° C.<br>Thickness: 4 mm | Pressure<br>change: 1.2 kPa/h<br>Temperature<br>change: 0° C./h<br>Transition<br>time: 10 h | Pressure: 6.65 kPa<br>Temperature: 2200° C.<br>Thickness: 2.7 mm<br>Growth rate: 90 μm/h | Pressure change:<br>1.2 kPa/h<br>Temperature<br>change: 5° C./h<br>Transition time:<br>10 h | Pressure: 1.3 kPa<br>Temperature:<br>2250° C.<br>Thickness: 10 mm | 40/cm$^2$ |
| Comparative<br>Example B5 | Pressure: 1.3 kPa<br>Temperature:<br>2200° C.<br>Thickness: 4 mm | Pressure<br>change: 1.3 kPa/h<br>Temperature<br>change: 0° C./h<br>Transition<br>time: 1 h | Pressure: 26.6 kPa<br>Temperature: 2200° C.<br>Thickness: 1 mm<br>Growth rate: 200 μm/h | Pressure change:<br>1.3 kPa/h<br>Temperature<br>change: 0° C./h<br>Transition time:<br>1 h | Pressure: 1.3 kPa<br>Temperature:<br>2200° C.<br>Thickness: 12 mm | 950/cm$^2$ |

Comparative Example B6

A 4H type SiC single crystal substrate having a main surface of a (0001) plane with a diameter of 50 mm and having an off angle inclined y 4 degrees in the (11-20) direction was cut from a SiC single crystal obtained in advance. The substrate was subjected to mirror surface polishing and used as a seed crystal. Although crystal growth was performed in the same manner as the confirmation experiment for structural conversion, atmosphere pressure during the crystal growth was adjusted to 1.3 kPa by the vacuum pumping device and the current value of work coil was adjusted such that growth temperature was 2250° C. Then, under the conditions of the growth atmosphere pressure and the seed crystal temperature above crystal growth was performed for 60.5 hours. The obtained silicon carbide single crystal had a diameter of 52 mm and a height of approximately 12 mm.

A (0001) plane substrate of the single crystal obtained above was cut and subjected to mirror surface polishing. Then, molten KOH etching was performed in the same manner as the confirmation experiment for structural conversion and screw dislocations were observed through an optical microscope to obtain a screw dislocation density of 1000/cm$^2$. In addition, separately, a (1-100) plane substrate of the crystal was cut and subjected to mirror surface polishing. Then, molten KOH etching was performed for optical microscopic observation. As a result, no stacking faults were observed, indicating that no conversion of screw dislocations to stacking faults had occurred.

Example B15

There were formed 4H type SiC seed single crystals with a diameter of 100 mm having respective screw dislocation densities of 2600, 3100, and 3600/cm$^2$. Using these seed crystals, the growth of 4H type SiC single crystals having a diameter of 100 mm was performed in the same manner as Example B1 of Table 3. In the obtained crystals, the thickness of a structural conversion induced layer obtained by step I was approximately 1 mm and the thickness of a normally grown layer obtained by step III was approximately 10 mm.

In silicon carbide single crystals obtained by step II, screw dislocation densities were measured in the same manner as Example B1. As a result, substrates cut from the normally grown portions of ingots formed from the seed crystals having the respective screw dislocation densities of 2600, 3100, and 3600/cm$^2$ had respective screw dislocation densities of 140, 180, and 210/cm$^2$. This showed that, even with the use of a seed crystal having a screw dislocation density exceeding 2500/cm$^2$, the manufacturing method of the present invention can reduce the screw dislocation density to 300/cm$^2$ or less.

Comparative Example B7

Similarly to Example B15, there was formed a 4H type SiC seed single crystal with a diameter of 100 mm having a screw dislocation density of 2600/cm$^2$. Then, the seed crystal was used to grow a 4H type SiC single crystal having a diameter of 100 mm in the same manner as Example B3 of Table 3. Herein, the time for structural conversion induced growth in step I was set to 4 hours, and the time for normal growth in step III was set to 50 hours. As a result, in the obtained crystal, the thickness of the structural conversion induced layer in step I was approximately 0.2 mm and the thickness of the normally grown layer in step II was 20 mm.

In the SiC single crystal obtained above, screw dislocation density was measured in the same manner as Example B1 and the screw dislocation density obtained was 1900/cm$^2$ as an average of the entire substrate surface.

Example B16

Under the same conditions as Example B1, a 4H—SiC single crystal was formed. Then, a substrate having a thickness of 0.5 mm was cut from the crystal in such a manner as to include a part of the structural conversion induced layer of step I and subjected to polishing to form a SiC single crystal substrate having a thickness of 350 μm. Similarly to the confirmation in Example B1, x-ray topographic observation was performed for a substrate cut from a region where the structural conversion of screw dislocations to stacking faults occurred, and showed the structural conversion of a plurality of screw dislocations to stacking faults. Due to the structural conversion, screw dislocation density was reduced to 110/cm$^2$, and from this region, a 3 mm-square SBD (Shottky Barrier Diode) of a withstand voltage 600 V class was formed to measure leakage current. The leakage current obtained was 10$^{-8}$ A or less and therefore it was possible to form a device with sufficiently less leakage current.

Comparative Example B8

Under the same conditions as those of Comparative Example B6, a 4H—SiC single crystal was formed and a substrate having a thickness of 0.5 mm was cut from the crystal. The substrate was polished to form a SiC single crystal substrate having a thickness of 30 μm. A screw dislocation density measured in the same manner as Example B1 was 1000/cm$^2$. A 3 mm-square SBD of a withstanding voltage 600 V class was formed from the substrate to measure a leakage current. The leakage current measured was 10$^{-4}$ A.

LIST OF REFERENCE SIGNS

1: Seed crystal
2: Structural conversion layer
3: Screw dislocation
4: Stacking fault
5: Main grown crystal
6: Bulk SiC single crystal
7: SiC single crystal substrate
7a Center circle region
7b: Doughnut-shaped peripheral region
8: SiC sublimation raw material
9: Graphite crucible
10: Graphite lid
11: Double quartz tube
12: Graphite supporting rod
13: Graphite felt
14: Work coil
15: Pipe
16: Mass flow controller
17: Vacuum pumping device

The invention claimed is:

1. A silicon carbide single crystal substrate that is a disk-shaped silicon carbide single crystal substrate cut from a bulk SiC single crystal grown by the Physical Vapor Transport (PVT) method, the silicon carbide single crystal substrate being characterized in that when, by representing the diameter of the substrate as R, a center circle region having a diameter of 0.5×R centered around a center point O of the substrate and a doughnut-shaped peripheral region remaining by excluding the center circle region of the substrate are defined, the average value of screw dislocation densities observed in the doughnut-shaped peripheral region is 80% or less of the average value of screw dislocation densities observed in the center circle region.

2. The silicon carbide single crystal substrate according to claim 1, wherein the average value of the screw dislocation densities observed in the doughnut-shaped peripheral region is 60% or less of the average value of the screw dislocation densities observed in the center circle region.

3. The silicon carbide single crystal substrate according to claim 1, wherein the average value of the screw dislocation densities observed in the doughnut-shaped peripheral region is 50% or less of the average value of the screw dislocation densities observed in the center circle region.

4. The silicon carbide single crystal substrate according to claim 1, wherein when four diameters dividing the circumference of the substrate into eight equal parts are arbitrarily selected on the substrate and eight radii $r_1$ to $r_8$ extending radially from the center point O of the substrate set to 0 are regarded as axes, each scaled from 0 to 1, the average value of the screw dislocation densities observed in the center circle region is an average of values measured at total 17 measurement points of i) to iii) below and the average value of the screw dislocation densities observed in the doughnut-shaped peripheral region is an average of values measured at total 16 measurement points of iv) to v) below:
   i) center point O
   ii) $a_1$ to $a_8$
   iii) $b_1$ to $b_8$
   iv) $c_1$ to $c_8$
   v) $d_1$ to $d_8$
   wherein numerals appended to symbols a to d correspond to numerals of the radii $r_1$ to $r_8$ and, for example, $a_1$, $b_1$, $c_1$, and $d_1$ represent measurement points present on the radius $r_1$; among the measurement points, a and b represent measurement points present within a range of from more than 0 and not more than 0.5 in each radius, and c and d represent measurement points present within a range of from more than 0.5 and not more than 1; and eight measurement points having the same symbol are present on the same circle of each of the symbols a to d.

5. The silicon carbide single crystal substrate according to claim 4, wherein the average value of the screw dislocation densities observed in the doughnut-shaped peripheral region is 500/cm$^2$ or less.

6. The silicon carbide single crystal substrate according to claim 4, wherein the average value of the screw dislocation densities observed in the doughnut-shaped peripheral region is 300/cm$^2$ or less.

7. The silicon carbide single crystal substrate according to claim 4, wherein the average value of the screw dislocation densities observed in the doughnut-shaped peripheral region is 100/cm$^2$ or less.

8. A method for manufacturing a silicon carbide single crystal by the PVT method using a seed crystal, the method being characterized by including:
   a first growth step of growing a silicon carbide single crystal having a thickness of at least 0.5 mm at a first growth atmosphere pressure of from 3.9 to 39.9 kPa and a first growth temperature in which the temperature of the seed crystal is not less than 2100° C. and below 2300° C., wherein a first growth rate is 100 μm/h or less, and
   a second growth step of growing the silicon carbide single crystal to a larger thickness than in the first growth step at a second growth atmosphere pressure of from 0.13 to 2.6 kPa and a second growth temperature in which the temperature of the seed crystal is higher than the first growth temperature and below 2400° C.

9. The method for manufacturing a silicon carbide single crystal according to claim 8, wherein the first growth atmosphere pressure is reduced to the second growth atmosphere pressure at a pressure changing rate of 12 kPa or less per hour.

10. The method for manufacturing a silicon carbide single crystal according to claim 8, wherein the first growth temperature is increased to the second growth temperature at a temperature changing rate of 40° C. or less per hour.

11. The method for manufacturing a silicon carbide single crystal according to claim 8, wherein the first growth step is performed at a crystal growth rate of 100 μm/hr or less.

12. The method for manufacturing a silicon carbide single crystal according to claim 8, wherein, in the entire growth process including the first and the second growth steps, the first growth step is performed within a time of ½ or less of the entire growth process after starting the crystal growth.

13. The silicon carbide single crystal substrate according to claim 2, wherein when four diameters dividing the circumference of the substrate into eight equal parts are arbitrarily selected on the substrate and eight radii $r_1$ to $r_8$ extending radially from the center point O of the substrate set to 0 are regarded as axes, each scaled from 0 to 1, the average value of the screw dislocation densities observed in the center circle region is an average of values measured at total 17 measurement points of i) to iii) below and the average value of the screw dislocation densities observed in the doughnut-shaped peripheral region is an average of values measured at total 16 measurement points of iv) to v) below:
   i) center point O
   ii) $a_1$ to $a_8$
   iii) $b_1$ to $b_8$
   iv) $c_1$ to $c_8$
   v) $d_1$ to $d_8$
   wherein numerals appended to symbols a to d correspond to numerals of the radii $r_1$ to $r_8$ and, for example, $a_1$, $b_1$, $c_1$, and $d_1$ represent measurement points present on the radius $r_1$; among the measurement points, a and b represent measurement points present within a range of from more than 0 and not more than 0.5 in each radius, and c and d represent measurement points present within a range of from more than 0.5 and not more than 1; and eight measurement points having the same symbol are present on the same circle of each of the symbols a to d.

14. The silicon carbide single crystal substrate according to claim 3, wherein when four diameters dividing the circumference of the substrate into eight equal parts are arbitrarily selected on the substrate and eight radii $r_1$ to $r_8$ extending radially from the center point O of the substrate set to 0 are regarded as axes, each scaled from 0 to 1, the average value of the screw dislocation densities observed in the center circle region is an average of values measured at total 17 measurement points of i) to iii) below and the average value of the screw dislocation densities observed in the doughnut-shaped peripheral region is an average of values measured at total 16 measurement points of iv) to v) below:
   i) center point O
   ii) $a_1$ to $a_8$
   iii) $b_1$ to $b_8$
   iv) $c_1$ to $c_8$
   v) $d_1$ to $d_8$
   wherein numerals appended to symbols a to d correspond to numerals of the radii $r_1$ to $r_8$ and, for example, $a_1$, $b_1$, $c_1$, and $d_1$ represent measurement points present on the radius $r_1$; among the measurement points, a and b represent measurement points present within a range of from more than 0 and not more than 0.5 in each radius, and c and d represent measurement points present within a range of from more than 0.5 and not more than 1; and eight measurement points having the same symbol are present on the same circle of each of the symbols a to d.

15. The method for manufacturing a silicon carbide single crystal according to claim 9, wherein the first growth temperature is increased to the second growth temperature at a temperature changing rate of 40° C. or less per hour.

16. The method for manufacturing a silicon carbide single crystal according to claim 9, wherein the first growth step is performed at a crystal growth rate of 100 μm/hr or less.

17. The method for manufacturing a silicon carbide single crystal according to claim 10, wherein the first growth step is performed at a crystal growth rate of 100 μm/hr or less.

18. The method for manufacturing a silicon carbide single crystal according to claim 9, wherein, in the entire growth process including the first and the second growth steps, the first growth step is performed within a time of ½ or less of the entire growth process after starting the crystal growth.

19. The method for manufacturing a silicon carbide single crystal according to claim 10, wherein, in the entire growth process including the first and the second growth steps, the first growth step is performed within a time of ½ or less of the entire growth process after starting the crystal growth.

20. The method for manufacturing a silicon carbide single crystal according to claim 11, wherein, in the entire growth process including the first and the second growth steps, the first growth step is performed within a time of ½ or less of the entire growth process after starting the crystal growth.

\* \* \* \* \*